(12) United States Patent
Zhang et al.

(10) Patent No.: US 12,183,298 B2
(45) Date of Patent: Dec. 31, 2024

(54) DISPLAY PANEL, DISPLAY APPARATUS AND DRIVING METHOD THEREOF

(71) Applicant: BOE Technology Group Co., Ltd., Beijing (CN)

(72) Inventors: Hui Zhang, Beijing (CN); Kai Hou, Beijing (CN); Hongrun Wang, Beijing (CN); Shunhang Zhang, Beijing (CN); Liwei Liu, Beijing (CN); Yunsik Im, Beijing (CN); Changfeng Li, Beijing (CN); Fuqiang Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/788,113

(22) PCT Filed: Aug. 27, 2021

(86) PCT No.: PCT/CN2021/115138
§ 371 (c)(1),
(2) Date: Jun. 22, 2022

(87) PCT Pub. No.: WO2023/024104
PCT Pub. Date: Mar. 2, 2023

(65) Prior Publication Data
US 2024/0169948 A1 May 23, 2024

(51) Int. Cl.
*G02F 1/1362* (2006.01)
*G02F 1/1368* (2006.01)
(Continued)

(52) U.S. Cl.
CPC ..... *G09G 3/3607* (2013.01); *G02F 1/136286* (2013.01); *G02F 1/1368* (2013.01);
(Continued)

(58) Field of Classification Search
CPC .................................................... G02F 1/1362
See application file for complete search history.

(56) References Cited

U.S. PATENT DOCUMENTS

2017/0179160 A1\* 6/2017 Takahashi ........... H01L 27/1225
2020/0111422 A1\* 4/2020 Park ..................... G09G 3/3291

FOREIGN PATENT DOCUMENTS

CN 112929647 \* 10/2020 ............. H04N 3/106

\* cited by examiner

*Primary Examiner* — Sang V Nguyen
(74) *Attorney, Agent, or Firm* — IPro, PLLC

(57) ABSTRACT

Disclosed are a display panel, a display apparatus, a driving method thereof. The display panel includes: a first base substrate; scanning lines; data lines; sub-pixels, in regions divided by the scanning lines and the data lines, at least two sub-pixels adjacent in a first direction and a second direction constitute a pixel island, the sub-pixels constitute pixel islands, each pixel island includes n sub-pixel rows in the second direction; scanning signal input lines, in one-to-one correspondence to the scanning lines; control signal lines; fixed potential lines; and control circuits, located between the adjacent sub-pixels. One pixel island is connected to at least n control circuits, one control circuit corresponds to one row of sub-pixels in the pixel island. The control circuits are configured to: transfer, under control of control signal lines, signals provided by the scanning signal input lines or the fixed potential lines to the scanning lines.

25 Claims, 19 Drawing Sheets

(51) Int. Cl.
*G09G 3/36* (2006.01)
*G09G 3/32* (2016.01)
(52) U.S. Cl.
CPC ............ *G09G 3/3666* (2013.01); *G09G 3/32* (2013.01); *G09G 2300/0408* (2013.01); *G09G 2300/0426* (2013.01); *G09G 2340/0414* (2013.01); *G09G 2340/0435* (2013.01); *G09G 2354/00* (2013.01)

18

14

19

15

20

22

21

35

16

18

14

7

15

19

17

20

20

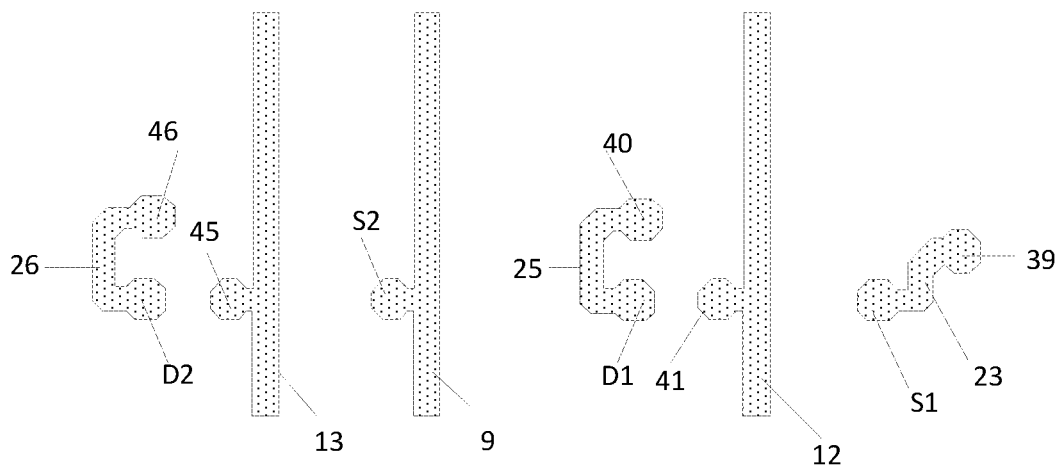
Fig. 26
43
Fig. 27
Fig. 28

44

21

35

DISPLAY PANEL, DISPLAY APPARATUS AND DRIVING METHOD THEREOF

CROSS-REFERENCE TO RELATED APPLICATIONS

This application is a National Stage of International Application No. PCT/CN2021/115138, filed Aug. 27, 2021, which is hereby incorporated by reference in its entirety.

FIELD

The present disclosure relates to the technical field of display, in particular to a display panel, a display apparatus and a driving method thereof.

BACKGROUND

With the continuous development of a display technology, ultra-high-resolution display has become a possibility. At present, display of a pixel density of up to 3000 (PPI) is no longer an illusion. However, limited by factors such as system capacity and graphics card processing speed, the ultra-high-resolution display is not popular, so a partition-driven intelligent display mode is proposed, which can normally display a region that human eyes pay attention to and reduce resolution and refresh frequency of the remaining regions. Therefore, a problem of insufficient system resources can be solved, and needs of low power consumption can also be met. However, display products in the prior art can only implement a function of horizontal partitioned driving, but cannot implement vertical partitioning.

SUMMARY

An embodiment of the present disclosure provides a display panel. The display panel includes:
- a first base substrate;
- a plurality of scanning lines, located on a side of the first base substrate, and extending in a first direction, and arranged in a second direction, wherein the first direction intersects with the second direction;
- a plurality of data lines, located on the side of the first base substrate, and extending in the second direction, and arranged in the first direction;
- a plurality of sub-pixels, respectively located in regions divided by the plurality of scanning lines and the plurality of data lines, wherein at least two sub-pixels adjacent in the first direction and the second direction constitute a pixel island, the plurality of sub-pixels constitute a plurality of pixel islands, and each pixel island includes n sub-pixel rows in the second direction; and
- a plurality of scanning signal input lines, in one-to-one correspondence to the scanning lines, extending in the first direction, and arranged in the second direction;
- a plurality of control signal lines, extending in the second direction and arranged in the first direction;
- a plurality of fixed potential lines; and
- a plurality of control circuits, located between the adjacent sub-pixels, wherein one pixel island is connected to at least n control circuits correspondingly, and one control circuit corresponds to one row of sub-pixels in the pixel island;
- the control circuits are configured to: transfer, under control of the control signal lines, signals provided by the scanning signal input lines or signals provided by the fixed potential lines to the scanning lines.

In some embodiments, each of the control circuits includes: a first transistor and a second transistor;
- a control pole of the first transistor is electrically connected to one control signal line, a first pole of the first transistor is electrically connected to the scanning signal input lines, and a second pole of the first transistor is electrically connected to the scanning lines;
- a control pole of the second transistor is electrically connected to one control signal line, a first pole of the second transistor is electrically connected to the fixed potential lines, and a second pole of the second transistor is electrically connected to the scanning lines.

In some embodiments, the control circuits are located between two sub-pixels adjacent in the first direction;
- the plurality of fixed potential lines extend in the first direction and are arranged in the second direction.

In some embodiments, the display panel includes:
- a first conductive layer, including the scanning lines, the scanning signal input lines, the fixed potential lines, the control poles of the first transistors and the control poles of the second transistors;
- a second conductive layer, located on a side facing away from the first base substrate, of the first conductive layer and including the data lines and the control signal lines; and
- a third conductive layer, located on a side facing away from the first conductive layer, of the second conductive layer and including the first poles and the second poles of the first transistors as well as the first poles and the second poles of the second transistors.

In some embodiments, the sub-pixels include driving transistors, and the first conductive layer further includes: control poles of the driving transistors electrically connected to the scanning lines;
- the second conductive layer further includes: a first pole of the driving transistor; and
- the third conductive layer further includes: a second pole of the driving transistor.

In some embodiments, in each of the control circuits, the first transistor and the second transistor are arranged into two rows in the first direction.

In some embodiments, in each of control circuits, an orthographic projection of the control pole of the first transistor on a plane perpendicular to the first direction do not overlap an orthographic projection of the control pole of the second transistor on the plane perpendicular to the first direction.

In some embodiments, the first pole and the second pole of the first transistor are arranged in the second direction; and the first pole and the second pole of the second transistor are arranged in the second direction.

In some embodiments, the third conductive layer further includes: a first input lead, a second input lead, a first output lead and a second output lead;
- the first input lead is electrically connected to the first pole of the first transistor and electrically connected to the scanning signal input line;
- the second input lead is electrically connected to the first pole of the second transistor and electrically connected to the fixed potential lines;
- the first output lead is electrically connected to the second pole of the first transistor and electrically connected to the scanning lines;

the second output lead is electrically connected to the second pole of the second transistor and electrically connected to the scanning lines; and the first input lead, the second input lead, the first output lead and the second output lead all extend in the second direction.

In some embodiments, the control circuits are located between two sub-pixels adjacent in the second direction; and the plurality of fixed potential lines extend in the second direction and are arranged in the first direction.

In some embodiments, the display panel includes:

a first conductive layer, including the scanning lines, the control pole of the first transistor and the control pole of the second transistors;

a second conductive layer, located on a side facing away from the first base substrate, of the first conductive layer and including the scanning signal input lines;

a third conductive layer, located on a side facing away from the first conductive layer, of the second conductive layer and including the data lines; and a fourth conductive layer, located on a side facing away from the second conductive layer, of the third conductive layer and including the control signal lines, the fixed potential lines, the first pole and the second pole of the first transistor as well as the first pole and the second pole of the second transistor, wherein orthographic projections of the control signal lines and the fixed potential lines on the first base substrate overlap part of orthographic projections of the data lines on the first base substrate.

In some embodiments, the fourth conductive layer further includes: a plurality of first output leads and a plurality of second output leads extending in the second direction;

the second pole of the first transistor is electrically connected to the scanning lines through the first output leads;

the second pole of the second transistor is electrically connected to the scanning lines through the second output leads; and orthographic projections of the first output leads and the second output leads on the first base substrate overlap part of the orthographic projections of the data lines on the first base substrate.

In some embodiments, the sub-pixels include driving transistors;

the first conductive layer further includes: a control pole of the driving transistor electrically connected to the scanning lines;

the second conductive layer further includes: a first pole of the driving transistor; and the display panel further includes:

a fifth conductive layer, located on a side facing away from the third conductive layer, of the fourth conductive layer and including a second pole of the driving transistor.

In some embodiments, the control circuits corresponding to each pixel island are arranged into one row in the first direction.

In some embodiments, the first pole of the first transistor, the control pole of the first transistor, and the second pole of the first transistor are arranged in the first direction; and the first pole of the second transistor, the control pole of the second transistor, and the second pole of the second transistor are arranged in the first direction.

In some embodiments, the display panel further includes: an active layer located between the first conductive layer and the first base substrate; the active layer includes an active layer of the first transistor and an active layer of the second transistor;

the active layer of the first transistor includes parts extending in the first direction; and the active layer of the second transistor includes parts extending in the first direction.

In some embodiments, the fourth conductive layer further includes: a plurality of first output leads and a plurality of second output leads extending in the second direction;

the second pole of the first transistor is electrically connected to the scanning lines through the first output leads;

the second pole of the second transistor is electrically connected to the scanning lines through the second output leads; and orthographic projections of the first output leads and the second output leads on the first base substrate overlap part of the orthographic projections of the data lines on the first base substrate.

In some embodiments, the display panel further includes: a first gate insulating layer located between the first conductive layer and the active layer, a second gate insulating layer located between the first conductive layer and the second conductive layer, a first interlayer insulating layer located between the second conductive layer and the third conductive layer, a second interlayer insulating layer located between the third conductive layer and the fourth conductive layer, and a third interlayer insulating layer located between the fourth conductive layer and the fifth conductive layer;

the fourth conductive layer further includes: a plurality of first connecting pads, a plurality of second connecting pads, a plurality of third connecting pads, a plurality of fourth connecting pads, and a plurality of fifth connecting pads;

the second pole of the driving transistor is electrically connected to the active layer through a via hole that penetrates through the third interlayer insulating layer, the second interlayer insulating layer, the first interlayer insulating layer, the second gate insulating layer and the first gate insulating layer;

the first input leads are electrically connected to the first connecting pads, and the first connecting pads are electrically connected to the scanning signal input lines through via holes that penetrate through the second interlayer insulating layer and the first interlayer insulating layer;

the first output leads are electrically connected to the second connecting pads, and the second connecting pads are electrically connected to the scanning lines through via holes that penetrate through the second interlayer insulating layer, the first interlayer insulating layer and the second gate insulating layer;

first control signal lines are electrically connected to the third connecting pads, and the third connecting pads are electrically connected to the control pole of the first transistor through via holes that penetrate through the second interlayer insulating layer, the first interlayer insulating layer and the second gate insulating layer;

second control signal lines are electrically connected to the fourth connecting pads, and the fourth connecting pads are electrically connected to the control pole of the second transistor through via holes that penetrate through the second interlayer insulating layer, the first interlayer insulating layer and the second gate insulating layer; and the second output leads are electrically connected to the fifth connecting pads, and the fifth connecting pads are electrically connected to the scanning lines through via holes that penetrate through the second interlayer insulating layer, the first interlayer insulating layer and the second gate insulating layer; wherein in regions where the second pole of the driving transistor is electrically connected to the active layer, the first interlayer insulating layer, the second gate insulating layer and the first gate insulating layer include first via holes; in regions where the second connecting pads are electrically connected to the scanning lines, the first interlayer insulating layer and the second gate insulating layer include second via holes; and in the regions where the second pole of the driving transistor is electrically connected to the active layer and the regions where the second connecting pads are electrically connected to the scanning lines, the second interlayer insulating layer comprises third via holes that expose the first via holes and the second via holes.

In some embodiments, the display panel further includes:

a pixel electrode layer, located on a side facing away from the fourth conductive layer, of the fifth conductive layer and including a plurality of pixel electrodes in one-to-one correspondence to the sub-pixels, wherein the pixel electrodes are electrically connected to the second pole of the driving transistor;

a common electrode layer, located on a side facing away from the fifth conductive layer, of the pixel electrode layer;

a plurality of supporting parts, located on a side facing away from the pixel electrode layer, of the common electrode layer, wherein orthographic projections of the supporting parts on the first base substrate are between adjacent sub-pixel rows, and the control circuits are located between the sub-pixel rows provided with the supporting parts; and an opposing substrate, located on a side facing away from the common electrode layer, of the supporting parts and including a plurality of light shielding parts extending in the first direction and arranged in the second direction, wherein orthographic projections of the light shielding parts on the first base substrate cover the orthographic projections of the supporting parts on the first base substrate and the orthographic projections of the control circuits on the first base substrate.

In some embodiments, each of the pixels island includes:

a first sub-pixel row, a second sub-pixel row and a third sub-pixel row;

the first sub-pixel row includes a plurality of first color sub-pixels arranged in the first direction;

the second sub-pixel row includes a plurality of second color sub-pixels arranged in the first direction;

the third sub-pixel row includes a plurality of third color sub-pixels arranged in the first direction; and the orthographic projections of the supporting parts on the first base substrate are located between the first sub-pixel rows and the third sub-pixel rows.

In some embodiments, the first color sub-pixels are red sub-pixels, the second color sub-pixels are green sub-pixels and the third color sub-pixels are blue sub-pixels.

In some embodiments, the control pole of the first transistor and the control pole of the second transistor are electrically connected to a same control signal line;

the first transistor is a N-type transistor, and the second transistor is a P-type transistor; or, the first transistor is a P-type transistor, and the second transistors is a N-type transistor.

In some embodiments, the control pole of the first transistor and the control pole of the second transistor are electrically connected to different control signal lines.

In some embodiments, one row of the sub-pixels arranged in the first direction are in same color.

In some embodiments, the plurality of pixel islands are divided into a plurality of control regions, and each of the control regions includes at least one pixel island;

each of the scanning lines includes: a plurality of sub-scanning lines arranged in the first direction and disconnected from one another; and in each scanning line, the quantity of the sub-scanning lines are the same as the quantity of the control regions arranged in the first direction in one row, and each of the sub-scanning lines corresponds to one row of sub-pixels in one control region.

In some embodiments, in each of the control regions, one row of pixel islands arranged in the first direction are connected to n control circuits correspondingly.

An embodiment of the present disclosure provides a display apparatus, including:

the display panel provided by the embodiment of the present disclosure;

a cylindrical lens structure, located on a light emitting side of the display panel, wherein the cylindrical lens structure includes a plurality of cylindrical lens arranged in an array; and a controller, connected to the display panel and configured to provide a driving signal for the display panel.

An embodiment of the present disclosure provides a driving method of a display apparatus, including:

determining a gaze region and a non-gaze region of a user on the display apparatus in real time; and driving the gaze region to perform image display at a first refreshing rate and driving the non-gaze region to perform image display at a second refreshing rate, wherein the first refreshing rate is higher than the second refreshing rate.

In some embodiments, the driving the gaze region to perform image display at the first refreshing rate and driving the non-gaze region to perform image display at the second refreshing rate includes:

driving sub-pixels in the gaze region to refresh for A times; and driving sub-pixels in the non-gaze region to refresh for B times.

A and B are integer numbers, and A is larger than B.

In some embodiments, the driving the sub-pixels in the gaze region to refresh includes:

driving scanning signal input lines corresponding to the gaze region to sequentially transmit active level signals; and controlling the control signal lines to transmit control signals, transferring the signals provided by the scanning signal input lines to the scanning lines corresponding to the gaze region, and transferring signals provided by fixed potential lines to the scanning lines corresponding to the non-gaze region;

the driving the sub-pixels in the non-gaze region to refresh includes:

driving scanning signal input lines in the display panel to sequentially transmit active level signals; and controlling, in response to the sub-pixel rows corresponding to the gaze region being scanned, the control signal lines to transmit control signals, transferring signals provided by the fixed potential lines to the scanning lines corresponding to the gaze region, and transferring the signals provided by the scanning signal input lines to the scanning lines corresponding to the non-gaze region.

BRIEF DESCRIPTION OF THE DRAWINGS

In order to describe technical solutions in embodiments of the present disclosure more clearly, the accompanying drawings needed in description of the embodiments are briefly introduced below. Obviously, the accompanying drawings in the following description are only some embodiments of the present disclosure. Those ordinarily skilled in the art can further obtain other accompanying drawings according to these accompanying drawings without creative work.

FIG. 26 is a schematic structural diagram of a fourth conductive layer in a display panel provided by an embodiment of the present disclosure.

FIG. 27 is a schematic structural diagram of a third interlayer insulating layer in a display panel provided by an embodiment of the present disclosure.

FIG. 28 is a schematic structural diagram of a fifth conductive layer in a display panel provided by an embodiment of the present disclosure.

DETAILED DESCRIPTION OF THE EMBODIMENTS

Figure 1:
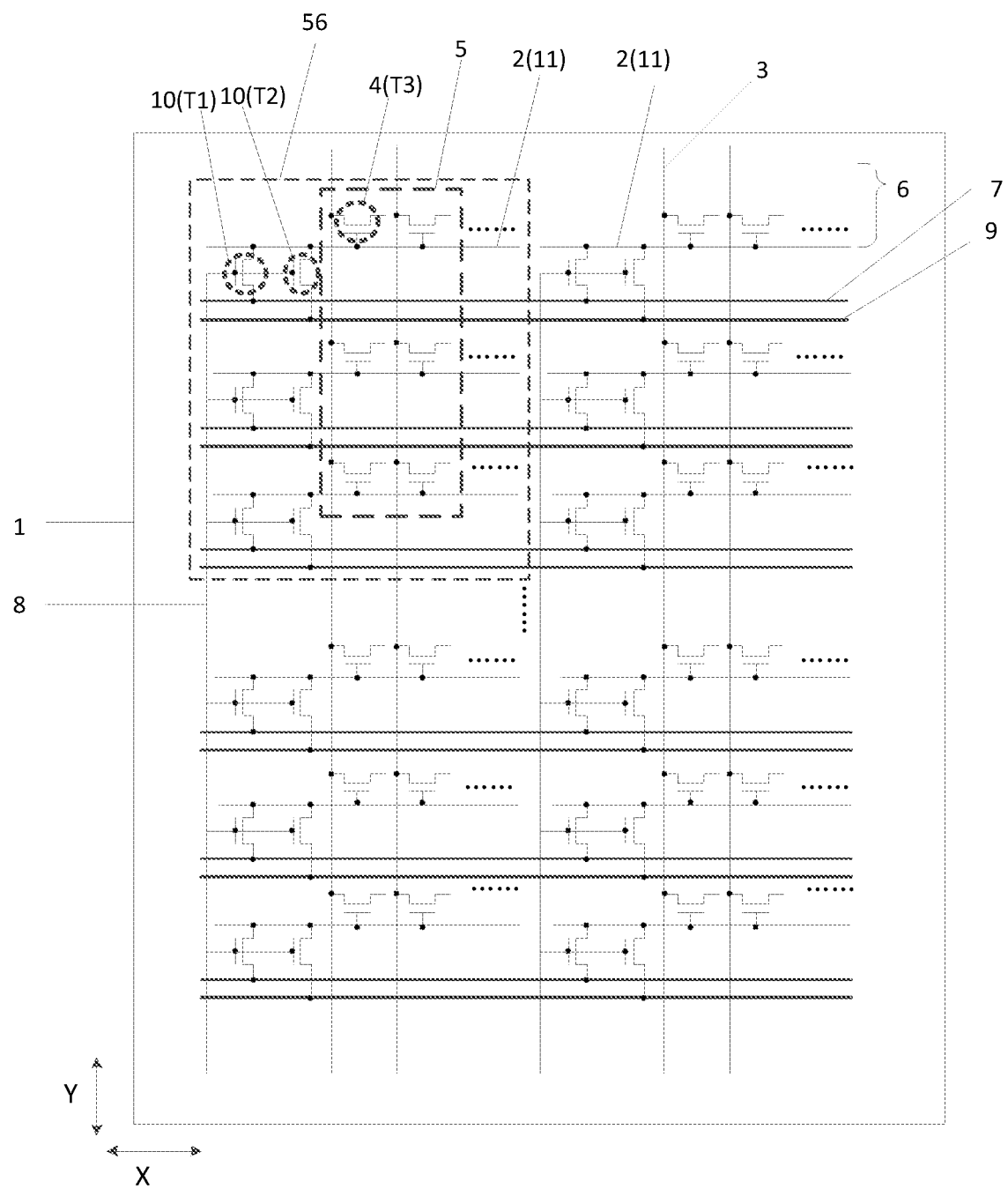
FIG. 1 is a schematic structural diagram of a display panel provided by an embodiment of the present disclosure.

In order to make objectives, technical solutions and advantages of embodiments of the present disclosure clearer, the technical solutions of the embodiments of the present disclosure will be clearly and completely described below with reference to the accompanying drawings of the embodiments of the present disclosure. Obviously, the described embodiments are a part of embodiments of the present disclosure, rather than all the embodiments. Under the condition that no conflict, the embodiments of the present disclosure and the features of the embodiments may be combined with each other. Based on the described embodiments of the present disclosure, all other embodiments obtained by those of ordinary skill in the art without creative efforts fall within the protection scope of the present disclosure.

Unless otherwise defined, technical or scientific terms used in the present disclosure shall have the ordinary meaning as understood by those of ordinary skill in the art to which this present disclosure belongs. "First", "second" and similar words used in the present disclosure do not represent any order, quantity, or importance, but are merely used to distinguish different components. Similar words such as "comprise" or "include" mean that elements or items appearing before the words encompass elements or items recited after the words and their equivalents, but do not exclude other elements or items. Similar words such as "connected" or "linked" are not limited to physical or mechanical connections, but may include electrical connections, whether direct or indirect.

It should be noted that dimensions and shapes of figures in the accompanying drawings do not reflect a real scale, and are only intended to illustrate the contents of the present disclosure. The same or similar reference numerals refer to the same or similar elements or elements having the same or similar functions throughout.

Figure 2:
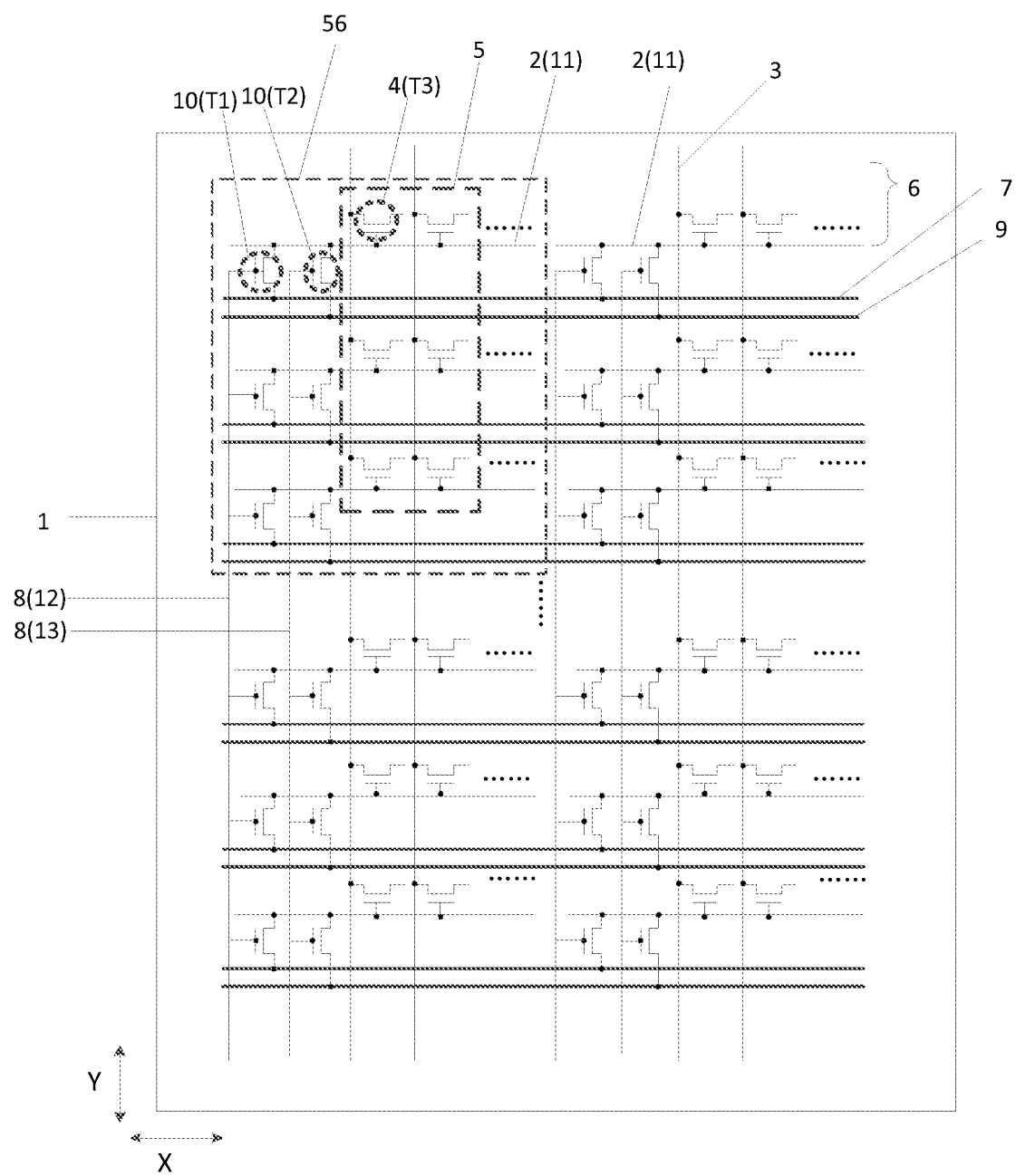
FIG. 2 is a schematic structural diagram of another display panel provided by an embodiment of the present disclosure.
Figure 3:
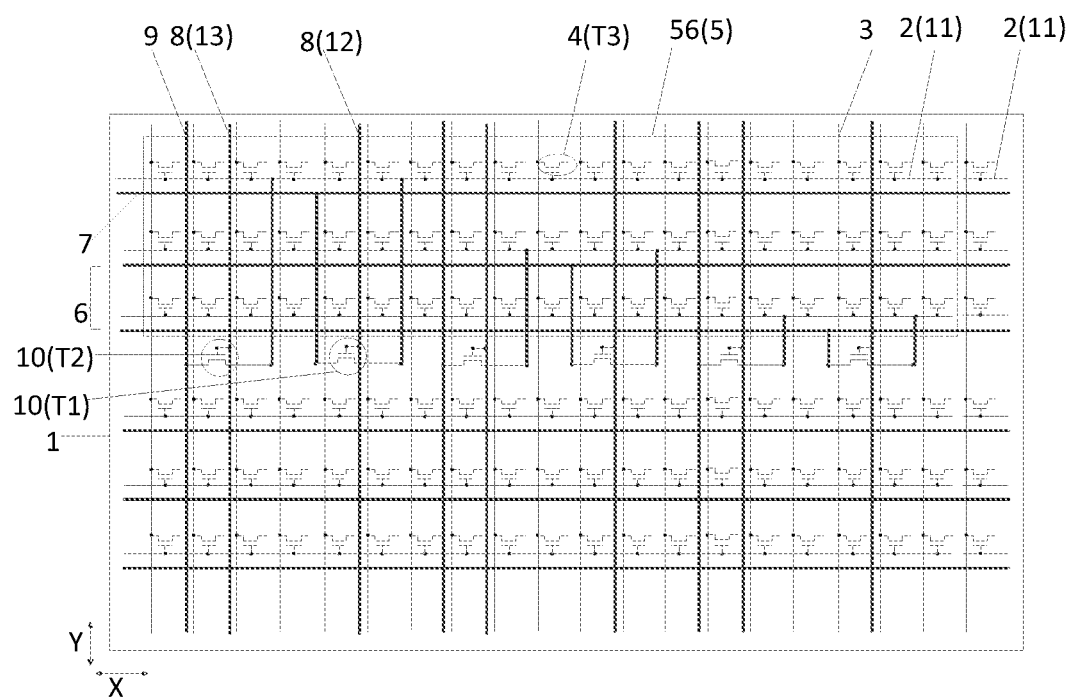
FIG. 3 is a schematic structural diagram of yet another display panel provided by an embodiment of the present disclosure.

An embodiment of the present disclosure provides a display panel. As shown in FIG. 1 to FIG. 3, the display panel includes:

- a first base substrate 1;
- a plurality of scanning lines 2, located on a side of the first base substrate 1, extending in a first direction X, and arranged in a second direction Y, wherein the first direction X intersects with the second direction Y;
- a plurality of data lines 3, located on the same side of the first base substrate 1 as the scanning lines 2, extending in the second direction Y, and arranged in the first direction X;
- a plurality of sub-pixels 4, respectively located in regions divided by the plurality of scanning lines 2 and the plurality of data lines 3, wherein at least two sub-pixels 4 adjacent in the first direction X and the second direction Y constitute a pixel island 5, the plurality of sub-pixels 4 constitute a plurality of pixel islands 5, and each pixel island 5 includes n sub-pixel rows 6 in the second direction Y;
- a plurality of scanning signal input lines 7, in one-to-one correspondence to the scanning lines 2, extending in the first direction X, and arranged in the second direction Y;
- a plurality of control signal lines 8, extending in the second direction Y and arranged in the first direction X;
- a plurality of fixed potential lines 9; and
- a plurality of control circuits 10, located between the adjacent sub-pixels 4, wherein one pixel island 5 is connected to at least n control circuits 10 correspondingly, and one control circuit 10 corresponds to one sub-pixel row 6 in the pixel island 5.

The control circuits 10 are configured to: transfer, under control of the control signal lines 8, signals provided by the scanning signal input lines 7 or signals provided by the fixed potential lines 9 to the scanning lines 2.

The display panel provided by embodiments of the present disclosure includes the control circuits as well as the control signal lines, the fixed potential lines and the scanning signal input lines that are electrically connected to the control circuits, so the control circuits may be used to transfer the signals provided by the scanning signal input lines or the signals provided by the fixed potential lines to the scanning lines. That is, in an image display process, for a region to be refreshed, the control circuits may be used to input normal scanning signals to the corresponding scanning lines, and for a region not to be refreshed, the control circuits may be used to input fixed potential signals transmitted by the fixed potential lines to the corresponding scanning lines. In this way, partitioned driving of the pixel islands can be realized, and therefore, energy consumption of a display product can be saved. In addition, the pixel islands are arranged in an array, and each pixel island are electrically connected to the control circuits, so partitioned control of the pixel islands in the display panel in the second direction can be realized.

In some embodiments, the display panel may be a rigid display panel, or may be a flexible display panel. That is, the display panel is bendable and foldable.

In some embodiments, the display panel provided by embodiments of the present disclosure is a liquid crystal display panel. It may be a twisted nematic (TN) type, a vertical alignment (VA) type, an in-plane switching (IPS) type or an advanced super dimension switch (ADS) type liquid crystal display panel.

In some embodiments, the liquid crystal display panel includes: an array substrate and an opposing substrate arranged opposite to each other, and a liquid crystal layer located between the array substrate and the opposing substrate. The signal lines and control circuits in FIG. 1 to FIG. 3, for example, may be arranged on the array substrate. As shown in FIG. 1 to FIG. 3, the sub-pixels 4 include driving transistors T3. The sub-pixels 4 further include pixel electrodes electrically connected to the driving transistors in one-to-one correspondence. The opposing substrate includes a first light shielding layer and color films. The color films corresponding to colors of the sub-pixels are arranged in opening regions of the first light shielding layer. In some embodiments, the liquid crystal display panel further includes a common electrode layer. The common electrode layer may be arranged in the array substrate, or may be arranged in the opposing substrate.

In some embodiments, the display panel provided by embodiment of the present disclosure is an electroluminescent display panel. The electroluminescent display panel may be, for example, an organic light-emitting diode (OLED) display panel, a quantum dot light-emitting diode (QLED) display panel, and the like. During specific implementation, each sub-pixel includes, for example, a pixel driving circuit and an electroluminescent device electrically connected to the pixel driving circuit, and the pixel driving circuit includes, for example, a transistor, a capacitor, and the like.

In some embodiments, the fixed potential lines input low-level signals.

In some embodiments, the display panel further includes gate driving circuits, and the plurality of scanning signal input lines are electrically connected to the gate driving circuits.

In this way, partitioned control of a plurality of rows of pixel islands can be realized by using the gate driving circuits, i.e. horizontal partitioned control is realized. That is, partitioned control of the pixel islands in the display panel may be performed in both the first direction and the second direction.

Figure 4:
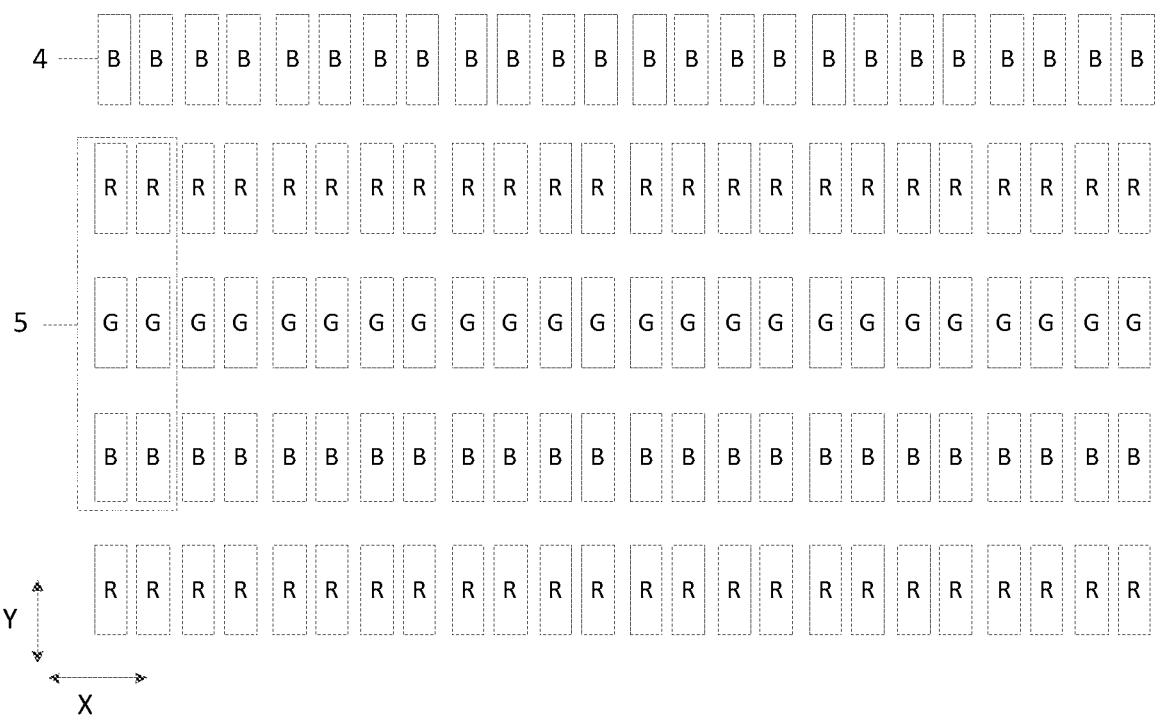
FIG. 4 is a schematic diagram of arrangement of sub-pixels in a display panel provided by an embodiment of the present disclosure.

In some embodiments, as shown in FIG. 4, one row of the sub-pixels 4 arranged in the first direction X are in the same color.

It should be noted that FIG. 4 merely illustrates part of the sub-pixels.

In some embodiments, as shown in FIG. 1 to FIG. 3, the plurality of pixel islands 5 are divided into a plurality of control regions 56, and each control region 56 includes at least one pixel island 5.

Each scanning line 2 includes: a plurality of sub-scanning lines 11 arranged in the first direction X and disconnected from one another; and in each scanning line 2, the quantity of the sub-scanning lines 11 are the same as the quantity of the control regions 56 arranged in the first direction X in one row, and each sub-scanning line 11 corresponds to one row of sub-pixels 4 in one control region 56.

That is, the scanning lines are disconnected among the control regions, so separate control of the control regions can be realized by using the control circuits.

In some embodiments, as shown in FIG. 1 to FIG. 3, one pixel island 5 is connected to n control circuits correspondingly.

In some embodiments, as shown in FIG. 1 to FIG. 3, in each control region 56, one row of pixel islands 5 arranged in the first direction X are connected to n control circuits 10 correspondingly.

Of course, during specific implementation, each pixel island may be connected to n control circuits.

In some embodiments, as shown in FIG. 1 to FIG. 3, each pixel island 5 includes 3 sub-pixel rows 6, i.e. n=3, and each pixel island 5 is connected to 3 control circuits 10 correspondingly.

In some embodiments, as shown in FIG. 1 to FIG. 3, each control circuit 10 includes: a first transistor T1 and a second transistor T2.

Control poles of the first transistors T1 are electrically connected to one control signal line 8, first poles of the first transistors T1 are electrically connected to the scanning signal input lines 7, and second poles of the first transistors T1 are electrically connected to the scanning lines 2.

Control poles of the second transistors T2 are electrically connected to one control signal line 8, first poles of the second transistors T2 are electrically connected to the fixed potential lines 9, and second poles of the second transistors T2 are electrically connected to the scanning lines 2.

During specific implementation, for the plurality of control circuits corresponding to one control region, under control of control signals input by the control signal lines, when the first transistors are turned on, and the second transistors are turned off, signals input by the scanning signal input lines are transferred to the scanning lines through the first transistors, so as to refresh the pixel islands in the control region. Under control of control signals input by the control signal lines, when the second transistors are turned on, and the first transistors are turned off, signals input by the fixed potential lines are transferred to the scanning lines through the second transistors, i.e. the pixel islands in the control region do not need to be refreshed.

In some embodiments, the second poles of the first transistors T1 and the second poles of the second transistors T2 in one control circuit are electrically connected to the same sub-scanning line.

In some embodiments, as shown in FIG. 1, the control poles of the first transistors T1 and the control poles of the second transistors T2 are electrically connected to the same control signal line 8.

The first transistors are N-type transistors, and the second transistors are P-type transistors; or, the first transistors are P-type transistors, and the second transistors are N-type transistors.

In some embodiments, as shown in FIG. 2 and FIG. 3, the control poles of the first transistors T1 and the control poles of the second transistors T2 are electrically connected to different control signal lines 8.

In some embodiments, as shown in FIG. 2 and FIG. 3, the plurality of control signal lines 8 include: a plurality of first control signal lines 12 and a plurality of second control signal lines 13.

The control poles of the first transistors T1 are electrically connected to the first control signal lines 12, and the control poles of the second transistors T2 are electrically connected to the second control signal lines 13.

During specific implementation, when the control poles of the first transistors and the control poles of the second transistors are electrically connected to different control signal lines, the first transistors may be N-type transistors, or may be P-type transistors; and the second transistors may be N-type transistors, or may be P-type transistors.

In some embodiments, as shown in FIG. 1 and FIG. 2, the control circuits 10 are located between two sub-pixels 4 adjacent in the first direction X.

The plurality of fixed potential lines 9 extend in the first direction X and are arranged in the second direction Y.

That is, as shown in FIG. 1 and FIG. 2, the control circuits 10 are located between two adjacent columns of sub-pixels 4.

A structure of the display panel will be described by examples taking the control circuits located between two adjacent columns of sub-pixels as an example.

Figure 5:
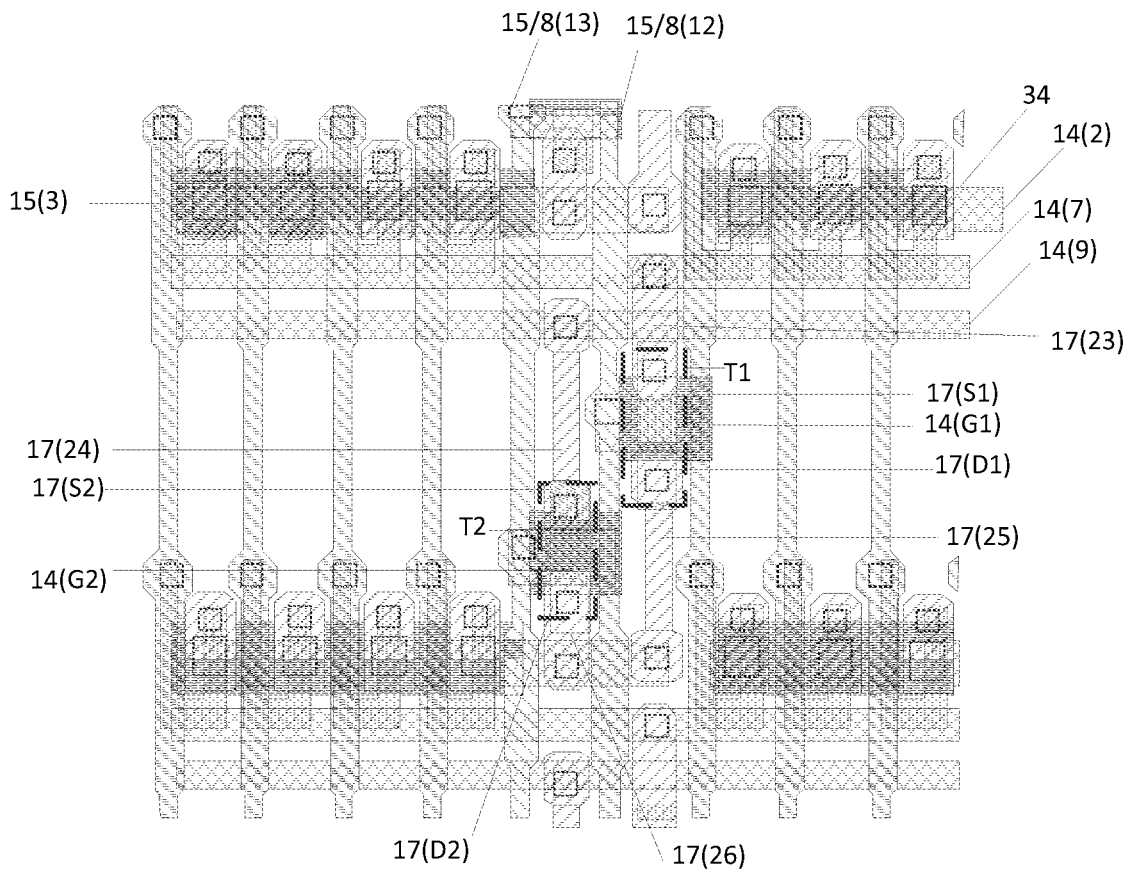
FIG. 5 is a schematic structural diagram of yet another display panel provided by an embodiment of the present disclosure.
Figure 6:
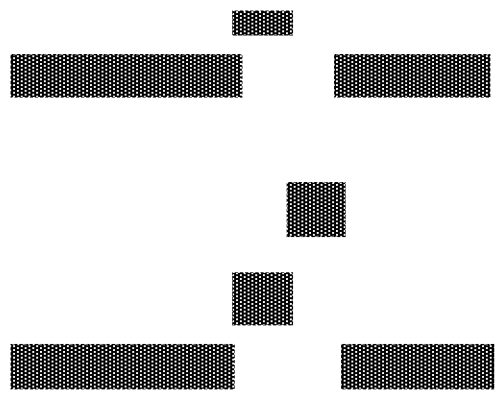
FIG. 6 is a schematic structural diagram of a second light shielding layer in a display panel provided by an embodiment of the present disclosure.
Figure 7:
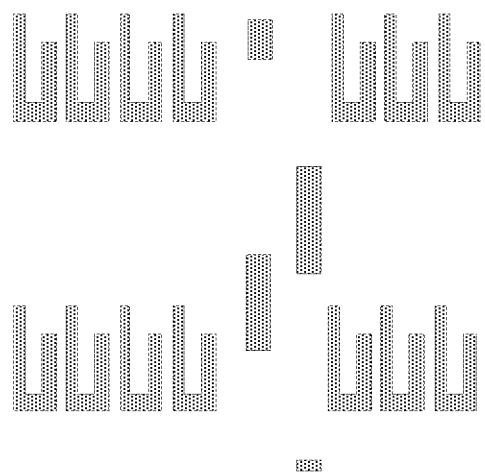
FIG. 7 is a schematic structural diagram of an active layer in a display panel provided by an embodiment of the present disclosure.

In some embodiments, as shown in FIG. 5, the display panel specifically includes:

a first conductive layer 14, including the scanning lines 2, the scanning signal input lines 7, the fixed potential lines 9, the control poles G1 of the first transistors T1 and the control poles G2 of the second transistors T2;

a second conductive layer 15, located on a side of the first conductive layer 14 facing away from the first base substrate and including the data lines 3 and the control signal lines 8; and a third conductive layer 17, located on a side of the second conductive layer 15 facing away from the first conductive layer 14 and including the first poles S1 and the second poles D1 of the first transistors T1 as well as the first poles S2 and the second poles D2 of the second transistors T2.

Figure 8:
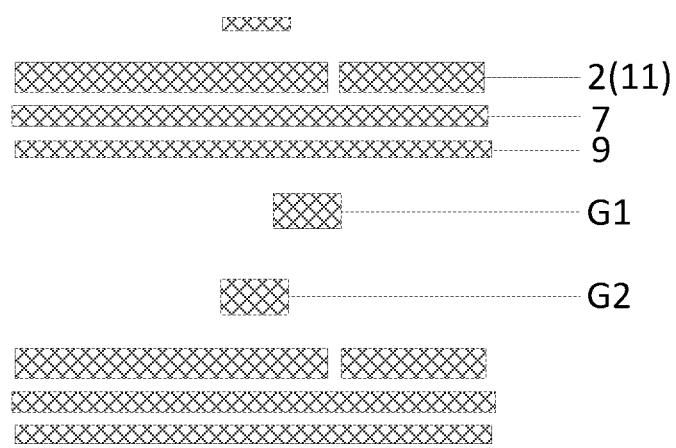
FIG. 8 is a schematic structural diagram of a first conductive layer in a display panel provided by an embodiment of the present disclosure.
Figure 10:
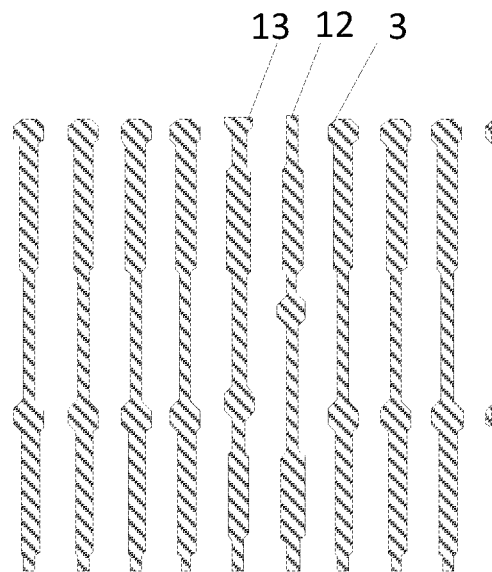
FIG. 10 is a schematic structural diagram of a second conductive layer in a display panel provided by an embodiment of the present disclosure.
Figure 12:
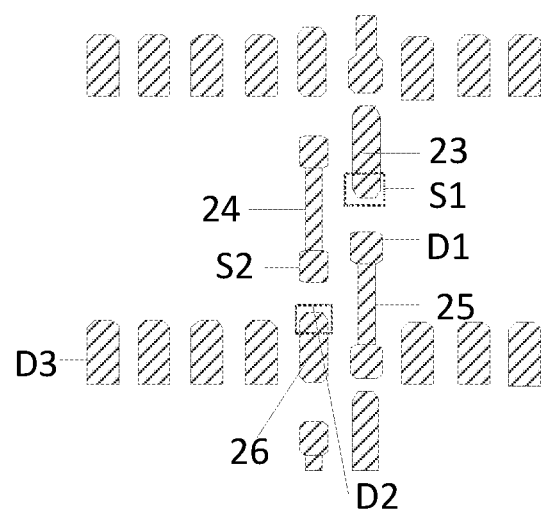
FIG. 12 is a schematic structural diagram of a third conductive layer in a display panel provided by an embodiment of the present disclosure.

Patterns of the first conductive layer 14, the second conductive layer 15, and the third conductive layer 17 corresponding to FIG. 5 are shown in FIG. 8, FIG. 10 and FIG. 12.

In some embodiments, as shown in FIG. 5, in each control circuit, the first transistor T1 and the second transistor T2 are arranged into two rows in the first direction.

In some embodiments, as shown in FIG. 5 and FIG. 8, in each control circuit, an orthographic projection of the control pole G1 of the first transistor T1 on a plane perpendicular to the first direction do not overlap an orthographic projection of the control pole G2 of the second transistor T2 on the plane perpendicular to the first direction. That is, the control poles G1 of the first transistors T1 and the control poles G2 of the second transistors T2 are not arranged along a straight line parallel to the first direction. In this way, even though the control poles G1 of the first transistors T1 and the control poles G2 of the second transistors T2 have overlapping regions in the second direction, the control poles G1 of the first transistors T1 and the control poles G2 of the second transistors T2 will not have a short circuit problem. Correspondingly, an overall width of the first transistors T1 and the second transistors T2 in the first direction may be reduced, so as to lower an influence caused by setting of the control circuits on an aperture ratio to the greatest extent.

In some embodiments, as shown in FIG. 5 and FIG. 10, in the second direction, in each first transistor T1, the first pole S1 of the first transistor T1 is located on a side of the second pole D2 of the first transistor T1; and in the second direction, in each second transistor T2, the first pole S2 of the second transistor T2 is located on a side of the second pole D2 of the second transistor T2. That is, the first poles S1 and second poles D1 of the first transistors T1 are arranged in the second direction, and the first poles S1 and the second poles D2 of the second transistors T2 are arranged in the second direction as well. In this way, it may be further avoided that a width of the first transistors T1 in the first direction and a width of the second transistors T2 in the first direction are increased, so as to lower the influence caused by setting of the control circuits on the aperture ratio to the greatest extent.

In some embodiments, when the display panel is a liquid crystal display panel, the sub-pixels include driving transistors. The first conductive layer further includes: control poles of the driving transistors electrically connected to the scanning lines 2.

The second conductive layer further includes: first poles of the driving transistors.

The third conductive layer further includes: second poles of the driving transistors.

In some embodiments, the first poles and the second poles of the driving transistors are located on different conductive layers, and the first poles and the second poles of the transistors of the control circuits are located on different conductive layers from the control signal lines, so distances between the second poles of the driving transistors and the data lines may be shortened, and distances between the first poles and the second poles of the transistors of the control circuits and the control signal lines may be shortened, which will not cause short circuit between the second poles of the driving transistors and the data lines or short circuit between the first poles and the second poles of the transistors of the control circuits and the control signal lines, thus lowering layout design difficulty of the display panel.

Figure 15:
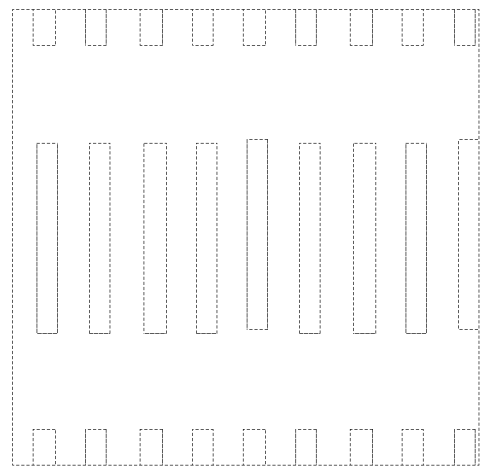
FIG. 15 is a schematic structural diagram of a common electrode layer in a display panel provided by an embodiment of the present disclosure.

In some embodiments, the display panel further includes: a pixel electrode layer located on a side of the third conductive layer facing away from the second conductive layer 15 and a common electrode layer located on a side of the pixel electrode layer facing away from the third conductive layer. The pixel electrode layer includes a plurality of pixel electrodes in one-to-one correspondence to the sub-pixels. The common electrode layer includes common electrodes. It should be noted that, in order to clearly illustrate a structure of the control circuits, FIG. 5 does not illustrate patterns of the common electrode layer or the pixel electrode layer. During specific implementation, the pattern of the pixel electrode layer 21 is as shown in FIG. 14, and the pattern of the common electrode layer 35 is as shown in FIG. 15.

Figure 9:
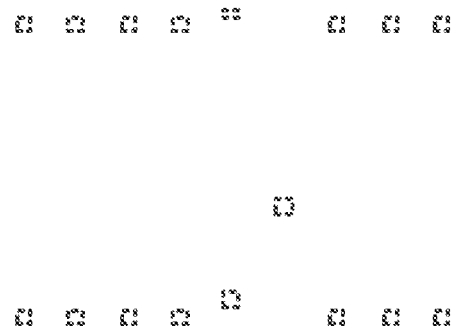
FIG. 9 is a schematic structural diagram of a first interlayer insulating layer in a display panel provided by an embodiment of the present disclosure.
Figure 11:
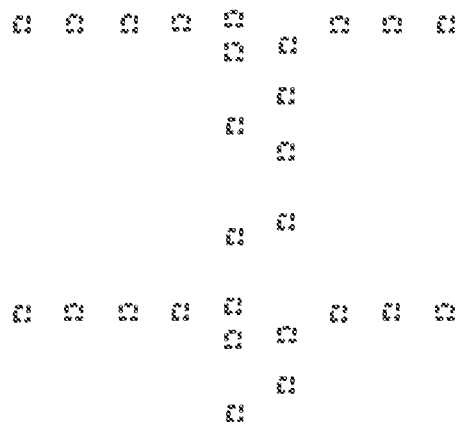
FIG. 11 is a schematic structural diagram of a second interlayer insulating layer in a display panel provided by an embodiment of the present disclosure.
Figures 13, 14:
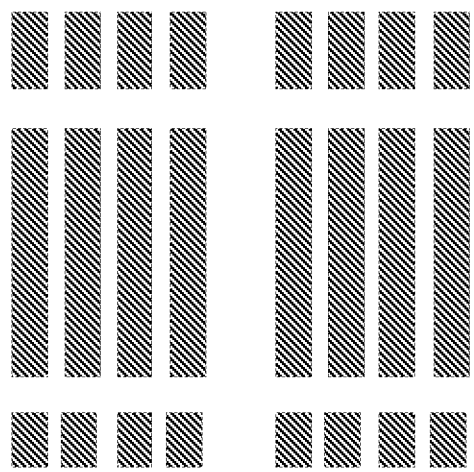
FIG. 13 is a schematic structural diagram of a first planarization layer in a display panel provided by an embodiment of the present disclosure.
FIG. 14 is a schematic structural diagram of a pixel electrode layer in a display panel provided by an embodiment of the present disclosure.

In some embodiments, as shown in FIG. 5, FIG. 6, FIG. 7, FIG. 9, FIG. 11, and FIG. 13, the display panel further includes a second light shielding layer 16 between the first conductive layer 14 and the first base substrate, an active layer 18 between the second light shielding layer 16 and the first conductive layer 14, a buffer layer (not shown) between the active layer 18 and the second light shielding layer 16, a gate insulating layer between the first conductive layer 14 and the active layer 18, a first interlayer insulating layer 19 between the first conductive layer 14 and the second conductive layer 15, a second interlayer insulating layer 20 between the second conductive layer 15 and the third conductive layer 17, a first planarization layer 22 between the third conductive layer 17 and the pixel electrode layer, and a second planarization layer between the pixel electrode layer and the common electrode layer. FIG. 6, FIG. 7, FIG. 9, FIG. 11, and FIG. 13 are respectively patterns of the second light shielding layer 16, the active layer 18, the first interlayer insulating layer 19, the second interlayer insulating layer 20, and the first planarization layer 22. Dotted regions in FIG. 9, FIG. 11, and FIG. 13 are regions of via holes of the first interlayer insulating layer 19, the second interlayer insulating layer 20, and the first planarization layer 22.

In some embodiments, as shown in FIG. 5, the third conductive layer further includes: first input leads 23, second input leads 24, first output leads 25 and second output leads 26. The first input leads 23 are electrically connected to the first poles S1 of the first transistors T1 and are electrically connected to the scanning signal input lines 7 through the via holes that penetrate through the second interlayer insulating layer and the first interlayer insulating layer. The second input leads 24 are electrically connected to the first poles S2 of the second transistors T2 and are electrically connected to the fixed potential lines 9 through via holes that penetrate through the second interlayer insulating layer and the first interlayer insulating layer. The first output leads 25 are electrically connected to the second poles D1 of the first transistors T1 and are electrically connected to the scanning lines 2 through the via holes that penetrate through the second interlayer insulating layer and the first interlayer insulating layer. The second output leads 26 are electrically connected to the second poles D2 of the second transistors T2 and are electrically connected to the scanning lines 2 through the via holes that penetrate through the second interlayer insulating layer and the first interlayer insulating layer. The first input leads 23, the second input leads 24, the first output leads 25 and the second output leads 26 all extend in the second direction Y.

In some embodiments, the first input leads 23 are integrally connected to the first poles S1 of the first transistors T1. The second input leads 24 are integrally connected to the first poles S2 of the second transistors T2. The first output leads 25 are integrally connected to the second poles D1 of the first transistors T1. The second output leads 26 are integrally connected to the second poles D2 of the second transistors T2.

In some embodiments, the first control signal lines 12 are electrically connected to the control poles G1 of the first transistors T1 through the via holes that penetrate through the first interlayer insulating layer. The second control signal lines 13 are electrically connected to the control poles G2 of the second transistors T2 through the via holes that penetrate through the first interlayer insulating layer. The first poles S1 and the second poles D1 of the first transistors T1 as well as the first poles S2 and the second poles D2 of the second transistors T2 are electrically connected to the active layer through via holes that penetrate through the second interlayer insulating layer, the first interlayer insulating layer and the gate insulating layer. The pixel electrodes are electrically connected to the second poles of the driving transistors through via holes that penetrate through the first planarization layer. The first poles of the driving transistors are electrically connected to the active layer through the via holes that penetrate through the first interlayer insulating layer and the gate insulating layer. The second poles of the driving transistors are electrically connected to the active layer through the via holes that penetrate through the second interlayer insulating layer, the first interlayer insulating layer and the gate insulating layer.

In some embodiments, the control circuits are arranged in an array. The control poles of the first transistors located in the same column in the second direction are electrically connected to the same first control signal line, and the control poles of the second transistors located in the same column in the second direction are electrically connected to the same second control signal line. The first poles of the first transistors located in the same row in the first direction are electrically connected to the same scanning signal input line, and the first poles of the second transistors located in the same row in the first direction are electrically connected to the same fixed potential line.

Figure 16:
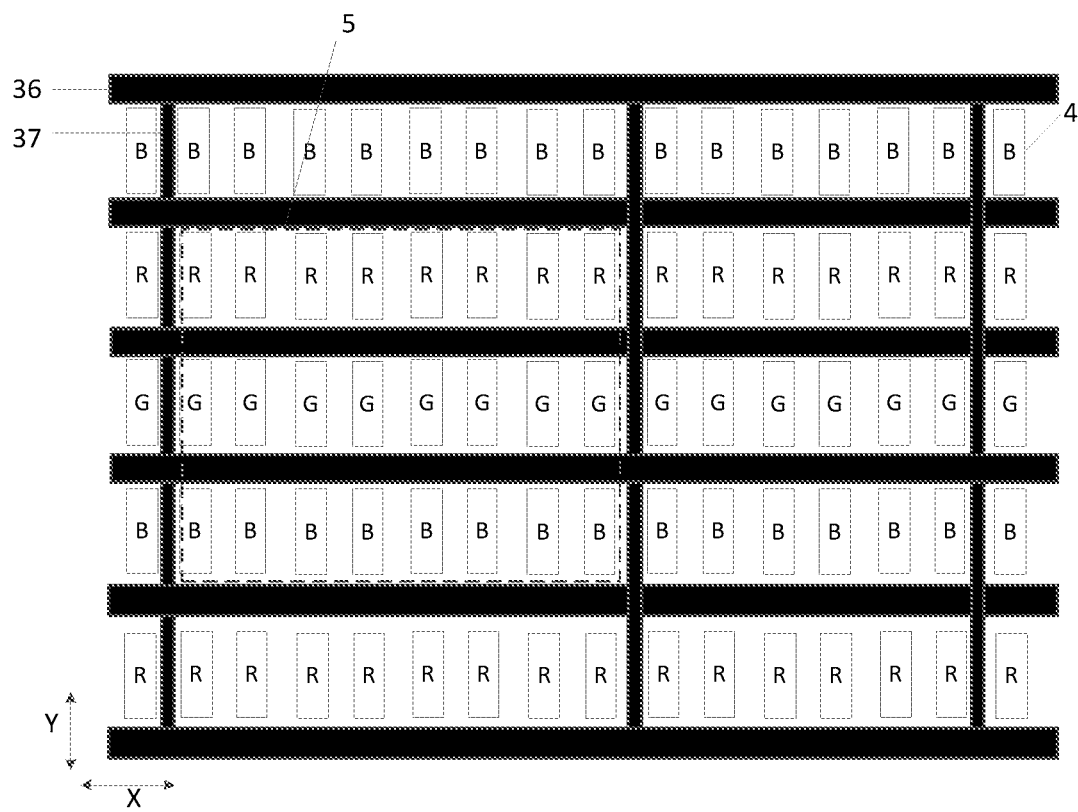
FIG. 16 is a schematic structural diagram of a first light shielding layer in a display panel provided by an embodiment of the present disclosure.

In some embodiments, as shown in FIG. 16, the first light shielding layer in the opposing substrate includes a plurality of first light shielding parts 36 extending in the first direction X and a plurality of second light shielding parts 37 extending in the second direction Y. The first light shielding parts 36 cover spaces between adjacent sub-pixel rows, i.e. the first light shielding parts 36 cover the scanning lines, the fixed potential lines and the scanning signal input lines. When the sub-pixels arranged in the first direction X are in the same color, the second light shielding parts 37 merely cover space between sub-pixel columns with the control circuits, i.e. the second light shielding parts cover the control circuits, the control signal lines, the input leads and the output leads. The second light shielding parts do not need to be set between sub-pixel columns without the control circuits, so that an aperture ratio of the sub-pixels can be increased as much as possible under a circumstance that the control circuits are shielded.

In some embodiments, as shown in FIG. 3, the control circuits 10 are located between two sub-pixels 4 adjacent in the second direction Y.

The plurality of fixed potential lines 9 extend in the second direction Y and are arranged in the first direction X.

That is, the control circuits 10 are located between adjacent sub-pixel rows.

In some embodiments, the control circuits corresponding to each pixel island are arranged in one row in the first direction X.

In some embodiments, the control poles of the first transistors arranged into one column in the second direction are electrically connected to the same first control signal line. The control poles of the second transistors arranged into one column in the second direction are electrically connected to the same second control signal line. The first poles of the second transistors arranged into one column in the second direction are electrically connected to the same fixed potential line.

The structure of the display panel will be described by examples taking the control circuits located between adjacent sub-pixel rows as an example.

Figure 17:
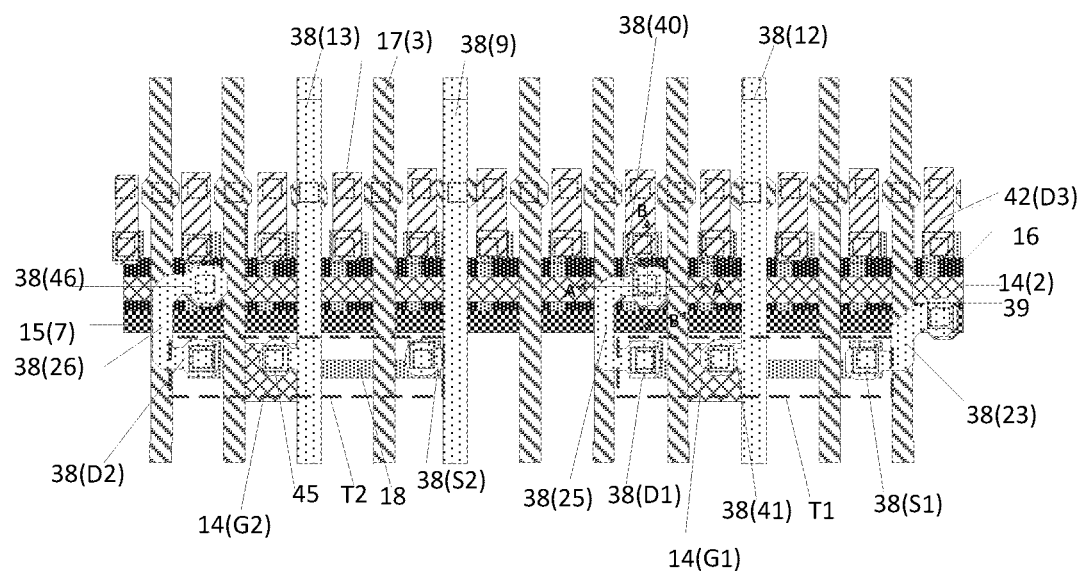
FIG. 17 is a schematic structural diagram of yet another display panel provided by an embodiment of the present disclosure.
Figure 18:
FIG. 18 is a schematic structural diagram of a second light shielding layer in another display panel provided by an embodiment of the present disclosure.
Figure 19:
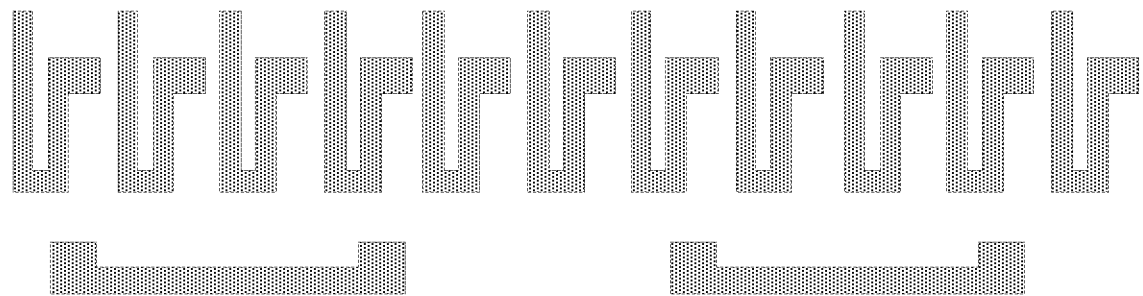
FIG. 19 is a schematic structural diagram of an active layer in another display panel provided by an embodiment of the present disclosure.
Figure 20:
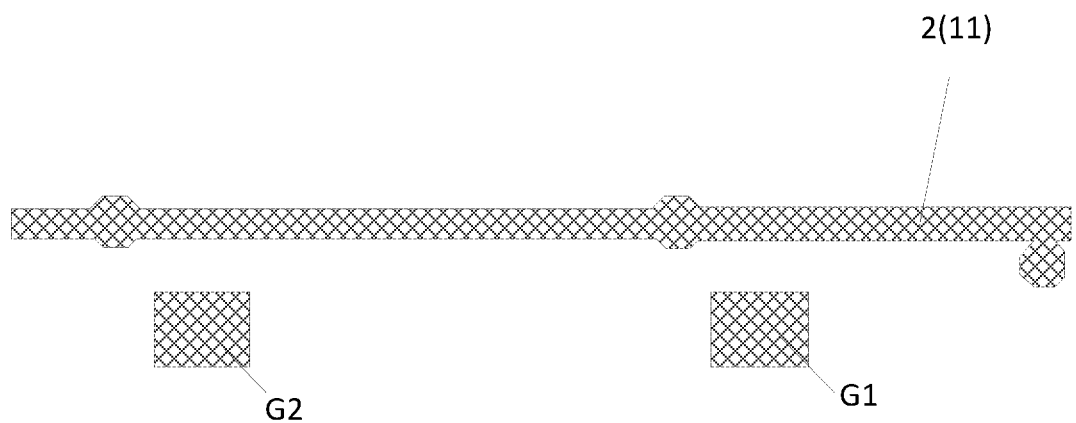
FIG. 20 is a schematic structural diagram of a first conductive layer in another display panel provided by an embodiment of the present disclosure.

In some embodiments, as shown in FIG. 17, the display panel specifically includes:
a first conductive layer 14, including the scanning lines 2, the control poles G1 of the first transistors T1 and the control poles G2 of the second transistors T2;
a second conductive layer 15, located on a side of the first conductive layer 14 facing away from the first base substrate and including the scanning signal input lines 7;
a third conductive layer 17, located on a side of the second conductive layer 15 facing away from the first conductive layer 14 and including data lines 3; and
a fourth conductive layer 38, located on a side of the third conductive layer 17 facing away from the second conductive layer 15 and including the control signal lines 8, the fixed potential lines 9, the first poles S1 and the second poles D1 of the first transistors T1 as well as the first poles S2 and the second poles D2 of the second transistors T2, wherein orthographic projections of the control signal lines 8 and the fixed potential lines 9 on the first base substrate overlap part of regions of orthographic projections of the data lines 3 on the first base substrate.

FIG. 20, FIG. 21, FIG. 23 and FIG. 26 respectively illustrate the patterns of the first conductive layer 14, the second conductive layer 15, the third conductive layer 17, and the fourth conductive layer 38 corresponding to FIG. 17.

It should be noted that FIG. 17 is the pattern of part of a region in one control region, so regions where the sub-scanning lines are disconnected are not shown.

During specific implementation, because the control signal lines, the fixed potential lines and the data lines are located on different conductive layers, orthographic projections of the control signal lines and the fixed potential lines on the first base substrate overlap part of regions of orthographic projections of the data lines on the first base substrate, so that an influence of signal lines electrically connected to the control circuits on the aperture ratio of the sub-pixels can be avoided.

In some embodiments, the sub-pixels include driving transistors.

The first conductive layer further includes: control poles of the driving transistors electrically connected to the scanning lines.

The second conductive layer further includes: first poles of the driving transistors. As shown in FIG. 17 and FIG. 28, the display panel further includes:
a fifth conductive layer 42, located on a side of the fourth conductive layer 38 facing away from the third conductive layer 17 and including second poles D3 of the driving transistors.

FIG. 28 is a pattern of the fifth conductive layer 42 corresponding to FIG. 17.

In some embodiments, the first poles and the second poles of the driving transistors are located on different conductive layers, so distances between the second poles of the driving transistors and the data lines may be shortened, and short circuit between the second poles of the driving transistors and the data lines will not be caused, thus lowering layout design difficulty of the display panel.

Figure 30:
FIG. 30 is a schematic structural diagram of a pixel electrode layer in another display panel provided by an embodiment of the present disclosure.
Figure 31:
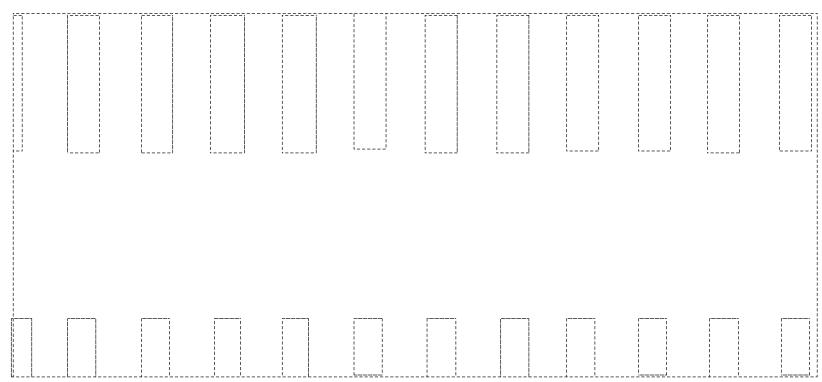
FIG. 31 is a schematic structural diagram of a common electrode layer in another display panel provided by an embodiment of the present disclosure.

In some embodiments, the display panel further includes: a pixel electrode layer located on a side of the fifth conductive layer facing away from the fourth conductive layer and a common electrode layer located on a side of the pixel electrode layer facing away from the fifth conductive layer. The pixel electrode layer includes pixel electrodes in one-to-one correspondence to the sub-pixels. The common electrode layer includes common electrodes. It should be noted that, in order to clearly illustrate a structure of the control circuits, FIG. 17 does not illustrate patterns of the common electrode layer or the pixel electrode layer. During specific implementation, the pattern of the pixel electrode layer 21 is as shown in FIG. 30, and the pattern of the common electrode layer 35 is as shown in FIG. 31.

It should be noted that the pixel electrode layer and the common electrode layer may be made of materials with a higher transmittance. The pixel electrode layer and the common electrode layer may include, for example, indium tin oxide (ITO). That is, the array substrate may be provided with two ITO layers. The first ITO layer is used as a pixel electrode layer, thereby reducing the quantity of via holes and increasing the aperture ratio. In some embodiments, the display panel further includes a metal common electrode line located in the same layer as the common electrode. During specific implementation, for example, a common electrode line is formed on the second passivation layer, and then an ITO common electrode electrically connected to the common electrode line is formed.

Figures 21, 22:
FIG. 21 is a schematic structural diagram of a second conductive layer in another display panel provided by an embodiment of the present disclosure.
FIG. 22 is a schematic structural diagram of a first interlayer insulating layer in another display panel provided by an embodiment of the present disclosure.
Figure 23:
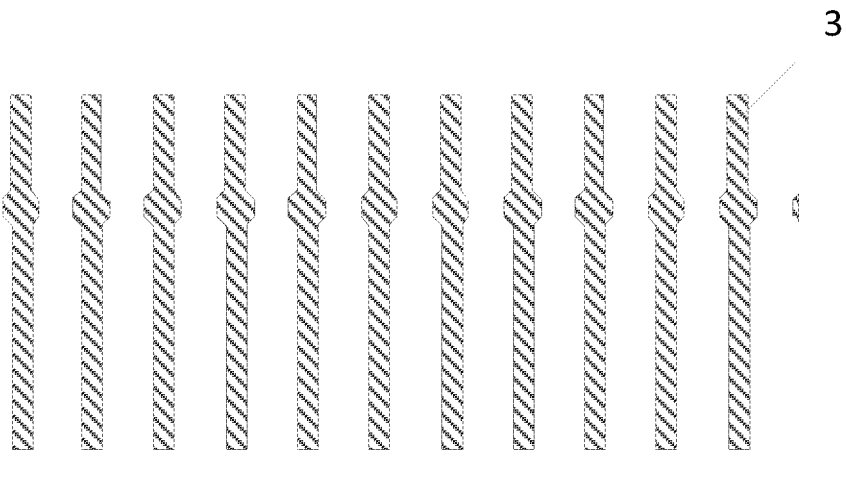
FIG. 23 is a schematic structural diagram of a third conductive layer in another display panel provided by an embodiment of the present disclosure.
Figure 29:
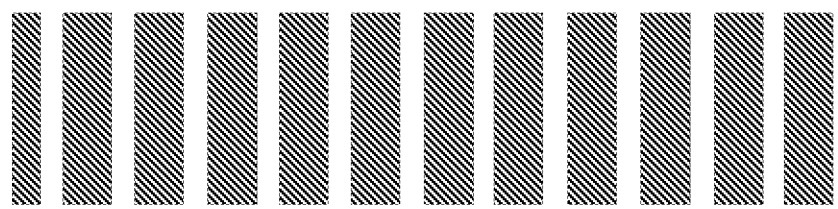
FIG. 29 is a schematic structural diagram of a first passivation layer in another display panel provided by an embodiment of the present disclosure.
Figure 32:
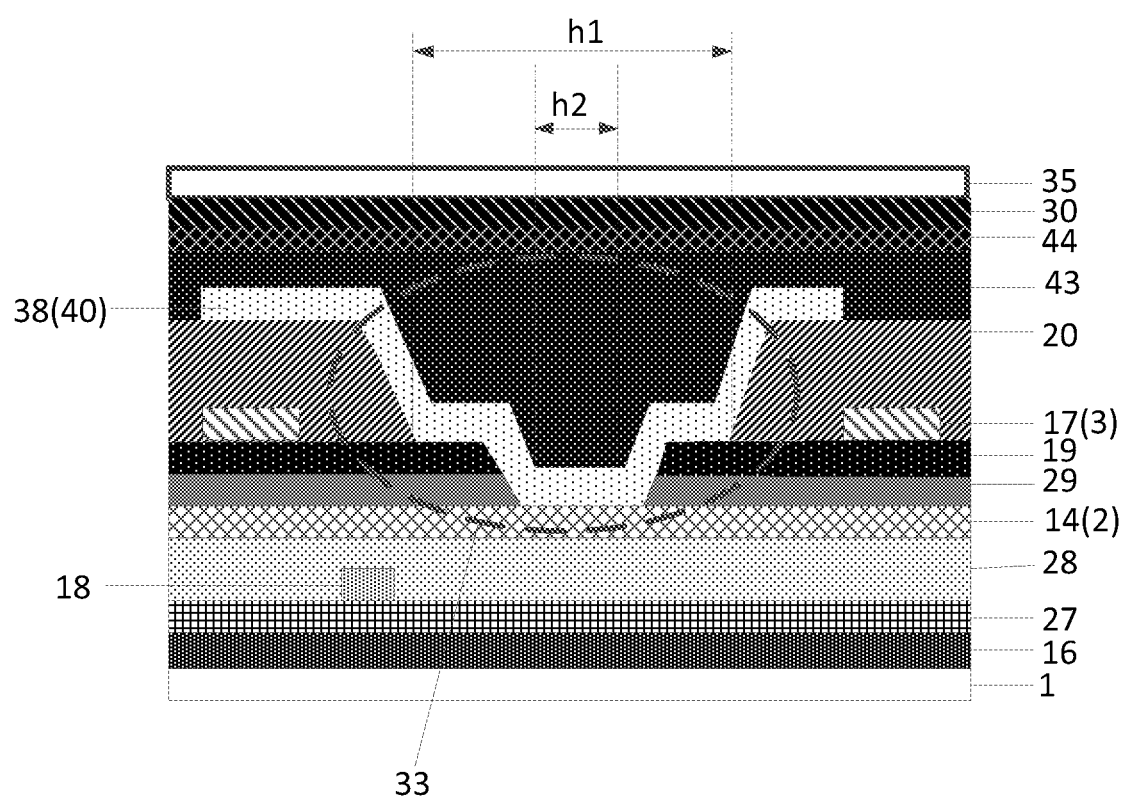
FIG. 32 is a sectional diagram along AA' in FIG. 17 provided by an embodiment of the present disclosure.
Figure 33:
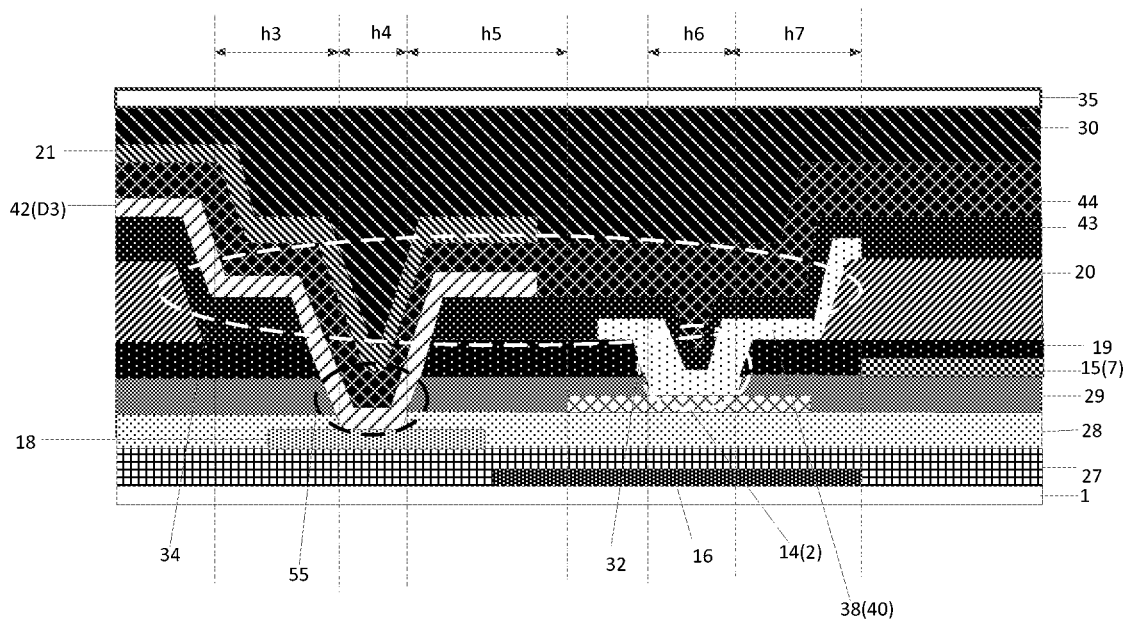
FIG. 33 is a sectional diagram along BB' in FIG. 17 provided by an embodiment of the present disclosure.

In some embodiments, as shown in FIG. 17, FIG. 18, FIG. 19, FIG. 22, FIG. 24, FIG. 25, FIG. 27, FIG. 29, FIG. 32, and FIG. 33, the display panel further includes a second light shielding layer 16 between the first conductive layer 14 and the first base substrate, an active layer 18 between the second light shielding layer 16 and the first conductive layer 14, a buffer layer 27 between the active layer 18 and the second light shielding layer 16, a first gate insulating layer 28 between the first conductive layer 14 and the active layer 18, a second gate insulating layer 29 between the first conductive layer 14 and the second conductive layer 15, a first interlayer insulating layer 19 between the second conductive layer 15 and the third conductive layer 17, a second interlayer insulating layer 20 between the third conductive layer 17 and the fourth conductive layer 38, a third interlayer insulating layer 43 between the fourth conductive layer 38 and the fifth conductive layer 42, a first passivation layer 44 between the fifth conductive layer and the pixel electrode layer, and a second passivation layer 30 between the pixel electrode layer and the common electrode layer. FIG. 18, FIG. 19, FIG. 22, FIG. 27, and FIG. 29 are respectively patterns of the second light shielding layer 16, the active layer 18, the first interlayer insulating layer 19, the third interlayer insulating layer 43, and the first passivation layer 44. FIG. 32 is a sectional diagram along AA' in FIG. 17, and FIG. 33 is a sectional diagram along BB' in FIG. 17. Dotted regions in FIG. 22, FIG. 27, and FIG. 29 are regions of via holes of the first interlayer insulating layer 19, the third interlayer insulating layer 43, and the first passivation layer 44. Dotted regions in FIG. 24 and FIG. 25 correspond to regions where via holes are formed after the second interlayer insulating layer 20 is formed.

Figure 24:
FIG. 24 is a schematic structural diagram of a second interlayer insulating layer in another display panel provided by an embodiment of the present disclosure.
Figure 25:
FIG. 25 is a schematic structural diagram of a second interlayer insulating layer in yet another display panel provided by an embodiment of the present disclosure.

In some embodiments, the second interlayer insulating layer plays a role of a planarization layer, and after the second interlayer insulating layer 20 is formed, via holes are formed by a first patterning process in the dotted region shown in FIG. 24. Subsequently, on the basis of the via holes formed by the first patterning process, via holes are formed by a second patterning process in the dotted region shown in FIG. 25. It should be noted that, after forming the first interlayer insulating layer, via holes are not formed in the dotted region shown in FIG. 25. In this way, by performing the second patterning process in the dotted region shown in FIG. 25, corresponding via holes may be formed in the first interlayer insulating layer and film layers below its, and subsequently the fourth conductive layer may be electrically connected to the active layer or the first conductive layer through the via holes formed in the dotted region shown in FIG. 25.

In some embodiments, as shown in FIG. 17, the first transistor T1 and second transistor T2 in each control circuit are arranged into one row in the first direction.

In some embodiments, as shown in FIG. 17, in each first transistor, the first pole S1 of the first transistor T1, the control pole G1 of the first transistor T1, and the second pole D1 of the first transistor T1 are arranged in the first direction.

In each second transistor T2, the first pole S2 of the second transistor T2, the control pole G2 of the second transistor T2, and the second pole D2 of the second transistor T2 are arranged in the first direction.

That is, when the first transistor and second transistor in each control circuit are arranged into one row in the first direction X, the first poles, control poles and second poles in the transistors in the control circuits are arranged into one row in the first direction X, so that sizes of the control circuits in the second direction Y can be reduced, thus further avoiding the influence of the control circuits on the aperture ratio of the sub-pixels.

In some embodiments, as shown in FIG. 17, the active layers of the first transistors T1 include parts extending in the first direction.

The active layers of the second transistors T2 include parts extending in the first direction.

In some embodiments, as shown in FIG. 17 and FIG. 26, the fourth conductive layer 38 further includes: a plurality of first output leads 25 and a plurality of second output leads 26 extending in the second direction Y.

The second poles D1 of the first transistors T1 are electrically connected to the scanning lines 2 through the first output leads 25.

The second poles D2 of the second transistors T2 are electrically connected to the scanning lines 2 through the second output leads 26.

Orthographic projections of the first output leads 25 and the second output leads 26 on the first base substrate overlap part of regions of orthographic projections of the data lines 3 on the first base substrate.

In some embodiments, because the first output leads, the first input leads and the second input leads are located on different conductive layers from the data lines, orthographic projections of the first output leads, the first input leads and the second input leads on the first base substrate overlap part of regions of orthographic projections of the data lines on the first base substrate, so that an influence of signal lines electrically connected to the control circuits on the aperture ratio of the sub-pixels can be avoided.

In some embodiments, as shown in FIG. 17 and FIG. 26, the fourth conductive layer 38 further includes: first input leads 23. The first poles S1 of the first transistors T1 are electrically connected to the scanning signal input lines 7 through the first input leads 23.

In some embodiments, as shown in FIG. 17 and FIG. 26, the fourth conductive layer 38 further includes: a plurality of first connecting pads 39, a plurality of second connecting pads 40, a plurality of third connecting pads 41, a plurality of fourth connecting pads 45, and a plurality of fifth connecting pads 46. The first input leads 23 are electrically connected to the first connecting pads 39, and the first connecting pads 39 are electrically connected to the scanning signal input lines 7 through the via holes that penetrate through the second interlayer insulating layer and the first interlayer insulating layer. As shown in FIG. 32, the first output leads 25 are electrically connected to the second connecting pads 40, and the second connecting pads 40 are electrically connected to the scanning lines 2 through the via holes 33 that penetrate through the second interlayer insulating layer 20, the first interlayer insulating layer 19 and the second gate insulating layer 29. The first control signal lines 12 are electrically connected to the third connecting pads 41, and the third connecting pads 41 are electrically connected to the control poles of the first transistors through the via holes that penetrate through the second interlayer insulating layer, the first interlayer insulating layer and the second gate insulating layer. The second control signal lines 13 are electrically connected to the fourth connecting pads 45, and the fourth connecting pads 45 are electrically connected to the control poles of the second transistors through the via holes that penetrate through the second interlayer insulating layer, the first interlayer insulating layer and the second gate insulating layer. The second output leads 26 are electrically connected to the fifth connecting pads 46, and the fifth connecting pads 46 are electrically connected to the scanning lines through the via holes that penetrate through the second interlayer insulating layer, the first interlayer insulating layer and the second gate insulating layer.

In some embodiments, as shown in FIG. 32, the second connecting pads 40 are electrically connected to the scanning lines 2 through fourth via holes 33 that penetrate through the second interlayer insulating layer 20, the first interlayer insulating layer 19 and the second gate insulating layer 29. During specific implementation, after the second interlayer insulating layer 20 is formed, in regions corresponding to the fourth via holes 33, via holes are formed in the second interlayer insulating layer 20 by a first patterning process. Then, via holes are formed in the first interlayer insulating layer 19 and the second gate insulating layer 29 by a second patterning process. Sizes h1 of the via holes in the second interlayer insulating layer 20 are larger than sizes of the via holes in the second gate insulating layer 29. Correspondingly, the second connecting pads 40 extend in a stepped mode in the regions of the fourth via holes 33, and sizes of the second connecting pads 40 in planar regions of the via holes in the second gate insulating layer 29 are h2. During specific implementation, h1 is, for example, 4 microns, and h2 is, for example, 2.5 microns.

In some embodiments, as shown in FIG. 33, the second poles D3 of the driving transistors are electrically connected to the active layer 18 through via holes that penetrate through the third interlayer insulating layer 43, the second interlayer insulating layer 20, the first interlayer insulating layer 19, the second gate insulating layer 29 and the first gate insulating layer 28. The second connecting pads 40 are electrically connected to the scanning lines 2 through the via holes that penetrate through the second interlayer insulating layer 20, the first interlayer insulating layer 19, and the second gate insulating layer 29. In regions where the second poles D3 of the driving transistors are electrically connected to the active layer 18, the first interlayer insulating layer 19, the second gate insulating layer 29 and the first gate insulating layer 28 have first via holes 55; in regions where the second connecting pads 40 are electrically connected to the scanning lines 2, the first interlayer insulating layer 19 and the second gate insulating layer 29 have second via holes 32; and in the regions where the second poles D3 of the driving transistors are electrically connected to the active layer 18 and the regions where the second connecting pads 40 are electrically connected to the scanning lines 2, the second interlayer insulating layer 20 has third via holes 34 that expose the first via holes 55 and the second via holes 32. During specific implementation, when the via holes need to be formed by two patterning process after the second interlayer insulating layer 20 is formed, the second interlayer insulating layer 20 in regions of the third via holes 34 is first removed by the first patterning process, and then the second via holes 32 are formed by the second patterning process. During specific implementation, sizes h4 of the first via holes 55 exposing the active layer 18 are, for example, 3 microns. Distances h3 between edges of the first via holes 55 exposing the active layer 18 and edges of the second interlayer insulating layer 20 exposing the first interlayer insulating layer 19 are, for example, 1.5 microns. Distances h5 between edges of the first via holes 55 exposing the active layer 18 and the scanning lines are, for example, 2.05 microns. Sizes h6 of the second via holes 32 exposing the scanning lines 2 are, for example, 2.5 microns. Distances h7 between edges of the second via holes 32 exposing the scanning lines 2 and the scanning signal input lines 7 are, for example, 2.5 microns.

In some embodiments, the display panel further includes:
the opposing substrate, located on a side facing away from the common electrode layer, of supporting parts and including light shielding parts; and
a liquid crystal layer, located between the opposing substrate and the common electrode layer.

Figure 34:
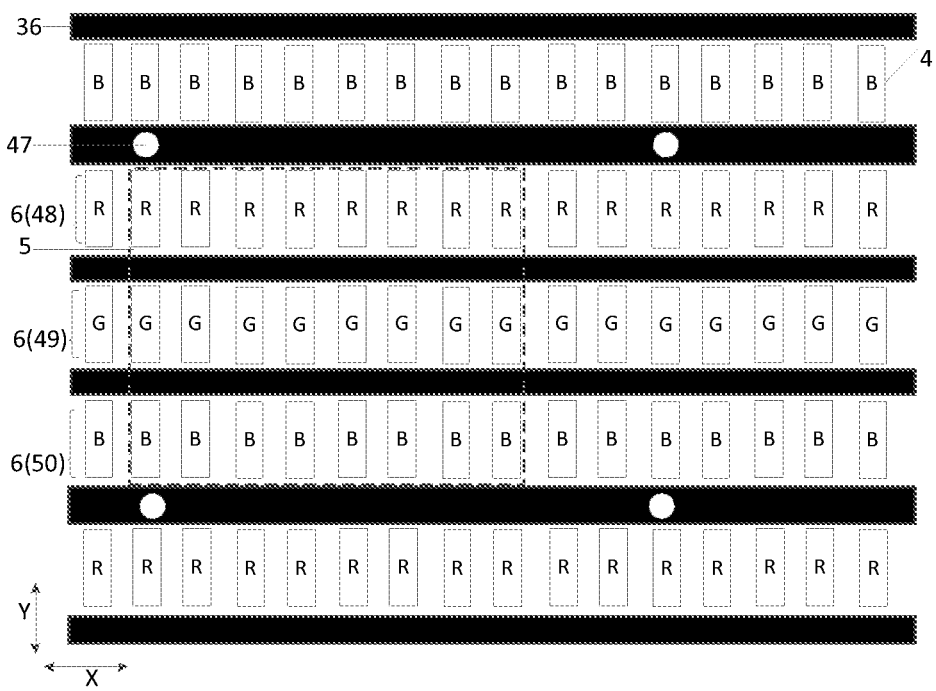
FIG. 34 is a schematic structural diagram of a first light shielding layer in another display panel provided by an embodiment of the present disclosure.

In some embodiments, the opposing substrate includes the first light shielding layer, and the first light shielding layer includes the light shielding parts. When the display panel is a liquid crystal display panel, the sub-pixels arranged in the first direction X are in the same color, and the control circuits are located between adjacent sub-pixel rows, as shown in FIG. 34, the light shielding parts of the first light shielding layer in the opposing substrate may merely include a plurality of first light shielding parts 36 extending in the first direction X. The first light shielding parts 36 cover the spaces between adjacent sub-pixel rows, i.e. the first light shielding parts 36 cover the scanning lines, the fixed potential lines, the scanning signal input lines and the control circuits. No control circuit is arranged between sub-pixel columns, and orthographic projections of the control signal lines, the fixed potential lines, input sub-leads and output sub-leads overlap part of regions of the scanning lines, so second light shielding parts are not required between the sub-pixel columns, thus increasing the aperture ratio of the sub-pixels.

In some embodiments, as shown in FIG. 34, the display panel further includes:
a plurality of supporting parts 47, located on a side of the common electrode layer facing away from the pixel electrode layer. Orthographic projections of the supporting parts 47 on the first base substrate are located between adjacent sub-pixel rows 6, and the control circuits are located between the sub-pixel rows provided with the supporting parts 47.

In some embodiments, as shown in FIG. 34, each pixel island 5 includes: a first sub-pixel row 48, a second sub-pixel row 49 and a third sub-pixel row 50.

The first sub-pixel row 48 includes a plurality of first color sub-pixels arranged in the first direction X.

The second sub-pixel row 49 includes a plurality of second color sub-pixels arranged in the first direction X.

The third sub-pixel row 50 includes a plurality of third color sub-pixels arranged in the first direction X.

In some embodiments, as shown in FIG. 34, in the second direction Y, widths of the first light shielding parts 36 covering spaces between the first sub-pixel rows 48 and the second sub-pixel rows 49 as well as widths of the first light shielding parts 36 covering spaces between the second sub-pixel rows 49 and the third sub-pixel rows 50 are smaller than widths of the first light shielding parts 36 covering spaces between the first sub-pixel rows 48 and the third sub-pixel rows 50.

Orthographic projections of the supporting parts 47 on the base substrate are located between the first sub-pixel rows 48 and the third sub-pixel rows 50.

Correspondingly, the control circuits are arranged between the first sub-pixel rows and the third sub-pixel rows.

During specific implementation, orthographic projections of the light shielding parts on the first base substrate cover orthographic projections of the supporting parts on the first base substrate and orthographic projections of the control circuits on the first base substrate. The supporting parts are arranged in regions where widths of the first light shielding parts are relatively large in the second direction Y. Therefore, according to the display panel provided by the embodiment of the present disclosure, the control circuits are arranged in regions of the supporting parts, so influence on the aperture ratio of the display panel can be avoided.

In some embodiments, as shown in FIG. 34, the first color sub-pixels are red sub-pixels R, the second color sub-pixels are green sub-pixels G and the third color sub-pixels are blue sub-pixels B.

It should be noted that, compared with the red sub-pixels and the blue sub-pixels, luminous efficiency of the green sub-pixels is more affected by the aperture ratio. Therefore, in the display panel provided by embodiments of the present disclosure, regions where the first light shielding parts have a greater width in the second direction Y are arranged between red sub-pixel rows and blue sub-pixel rows, which can avoid increasing influence of the widths of the first light shielding parts in the second direction Y on the green sub-pixels.

Next, preparation of the display panel provided by embodiments of the present disclosure will be described by examples taking the display panel being a liquid crystal display panel and the control circuits located between adjacent sub-pixel rows as examples. A preparation method of an array substrate includes the following steps:

S101, a second light shielding layer material is deposited on a first base substrate, and a pattern of a second light shielding layer is formed by using a patterning process;

S102, a buffer layer material is deposited to form a buffer layer;

S103, a semiconductor material is deposited, and a pattern of an active layer is formed through etching;

S104, a gate insulating layer material is deposited to form a first gate insulating layer;

S105, a gate metal material is deposited, an initial pattern of scanning lines, a pattern of control poles of first transistors, and a pattern of control poles of second transistors are formed through etching, and a conductor region is formed on the active layer by using a semiconductor self-alignment doping process, wherein each scanning line in the initial pattern of the scanning lines is integrally connected to one another;

S106, an etching process is performed on the initial pattern of the scanning lines, and each scanning line forms a plurality of sub-scanning lines disconnected from one another;

S107, a gate insulating layer material is deposited to form a second gate insulating layer;

S108, a metal material is deposited to form a second conductive layer, and a pattern of scanning signal input lines is formed through etching;

S109, a first interlayer insulating layer material is deposited, and a via hole is formed through etching;

S110, a metal material is deposited to form a third conductive layer, and a pattern of data lines and first poles of driving transistors is formed through etching;

S111, a planarization layer material is deposited to form a second interlayer insulating layer, and a via hole is formed by a first etching process;

S112, a via hole is formed by the etching process again;

S113, a metal material is deposited to form a fourth conductive layer, and a pattern of control signal lines, fixed potential lines, input leads, output leads, connecting pads and first poles and second poles of the first transistors as well as a pattern of first poles and second poles of the second transistors are formed through etching;

S114, a third interlayer insulating layer material is deposited, and a via hole is formed through etching;

S115, a metal material is deposited to form a fifth conductive layer, and a pattern of second poles of the driving transistors is formed through etching;

S116, a first passivation layer material is deposited to form a first passivation layer, and a via hole is formed by using an exposure process;

S117, ITO is deposited to form a pixel electrode layer, and a pixel electrode is formed through etching;

S118, a second passivation layer material is deposited to form a second passivation layer, and a via hole in a surrounding region is formed through etching;

S119, a metal material is deposited, and a pattern of common electrode lines is formed through etching; and S120, ITO is deposited, and a pattern of common electrodes is formed through etching.

In some embodiments, the forming the pattern of common electrodes further includes a step of forming a protective layer. When the supporting parts include a part arranged on a side of the array substrate, after forming the protective layer, a step of forming the supporting parts is further included.

Figure 35:
FIG. 35 is a schematic structural diagram of a display apparatus provided by an embodiment of the present disclosure.

An embodiment of the present disclosure provides a display apparatus, as shown in FIG. 35, including:
the display panel 51 provided by the embodiment of the present disclosure;
a cylindrical lens structure 52, located on a light emitting side of the display panel 51, wherein the cylindrical lens structure 52 includes a plurality of cylindrical lens arranged in an array; and
a controller (not shown), connected to the display panel and configured to provide a driving signal for the display panel.

During specific implementation, in an image display process, for a region to be refreshed, through the driving signal provided by the controller, a control circuit may be driven to input a normal scanning signal to a scanning line corresponding to a pixel island, and for a region not to be refreshed, through the driving signal provided by the controller, the control circuit may be driven to input a fixed potential signal transmitted by the a fixed potential line to the scanning line corresponding to the pixel island. In this way, partitioned driving of the pixel islands can be realized, so energy consumption of the display apparatus can be saved.

In some embodiments, as shown in FIG. 35, the display apparatus further includes:
a light-transmitting spacer layer 53, located between the display panel 51 and the cylindrical lens structure 52; and a flat layer 54, located on a side facing away from the light-transmitting spacer layer 53, of the cylindrical lens structure 52.

In some embodiments, when the display panel is a liquid crystal display panel, for example, the display apparatus further includes a backlight module located on the display panel facing away from the cylindrical lens structure.

In some embodiments, the display apparatus further includes:

an eye-tracking system, configured to determine a gaze region of a user's eyes on the display apparatus in real time.

During specific implementation, the gaze region may be refreshed at a high frequency while a non-gaze region may be refreshed at a low frequency.

During specific implementation, due to sub-pixel subdivision carried out in the pixel island (a sub pixel that can be displayed as a two-dimensional image (2D)), in a three-dimensional image (3D) display mode, the same resolution as the 2D display can be maintained. Combined with eye-tracking, multi-view display with a large viewing angle can be realized, and 3D display with a higher pixel density (PPI) can be realized, thus realizing larger information volume and lower color crosstalk between adjacent viewpoints. Dizziness of a user when viewing a 3D image can also be reduced, so user experience can be improved. When the display apparatus is provided with a cylindrical lens array, the cylindrical lens array may not only perform pixel mapping on the sub-pixels in the pixel island, but also perform light field modulation on emergent light from the pixel island, so that final emergent light from the pixel island can form multiple view points, so as to realize light field 3D display.

The display apparatus provided by embodiments of the present disclosure is: a mobile phone, a tablet computer, a television, a monitor, a notebook computer, a digital photo frame, a navigator and other product or component with a display function. Other essential components of the display apparatus should be understood by those of ordinary skill in the art, and will not be described in detail here, nor should it be regarded as a limitation to the present disclosure. For implementation of the display apparatus, reference may be made to the above-mentioned embodiment of the display panel, and repeated descriptions will not be made here.

Figure 36:
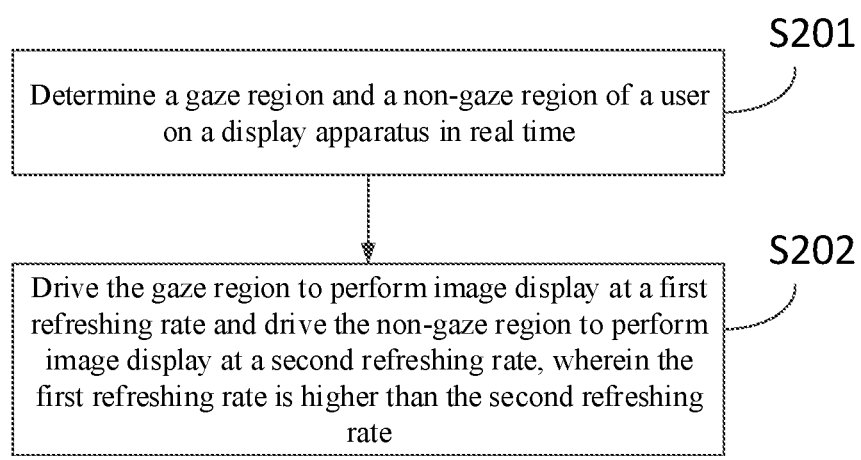
FIG. 36 is a schematic diagram of a driving method of a display apparatus provided by an embodiment of the present disclosure.

Based on the same inventive concept, an embodiment of the present disclosure further provides a driving method of a display apparatus, as shown in FIG. 36, including:

S201, a gaze region and a non-gaze region of a user on the display apparatus are determined in real time; and S202, the gaze region is driven to perform image display at a first refreshing rate and the non-gaze region is driven to perform image display at a second refreshing rate. The first refreshing rate is higher than the second refreshing rate.

According to the driving method of the display apparatus provided by the embodiment of the present disclosure, a refreshing frequency for the gaze region is higher than a refreshing frequency for the non-gaze region, so partitioned control of the refreshing rate of the display apparatus can be performed under a condition of not affecting the user's normally viewing a display picture, so energy consumption of the display apparatus can be saved.

In some embodiments, the determining the gaze region and the non-gaze region of the user on the display apparatus in real time includes:

the gaze region of the user on the display apparatus is determined by using the eye-tracking system; and other region in addition to the gaze region in the display apparatus is determined to be the non-gaze region.

In some embodiments, the driving the gaze region to perform image display at the first refreshing rate and driving the non-gaze region to perform image display at the second refreshing rate includes:

sub-pixels in the gaze region are driven to refresh for A times; and sub-pixels in the non-gaze region are driven to refresh for B times.

A and B are integer numbers, and A is larger than B.

In some embodiments, the driving the sub-pixels in the gaze region to refresh includes:

scanning signal input lines corresponding to the gaze region are driven to sequentially transmit active level signals; and control signal lines are controlled to transmit control signals, the signals provided by the scanning signal input lines are transferred to the scanning lines corresponding to the gaze region, and signals provided by fixed potential lines are transferred to the scanning lines corresponding to the non-gaze region.

The driving the sub-pixels in the non-gaze region to refresh includes:

scanning signal input lines in the display panel are driven to sequentially transmit active level signals; and when the sub-pixel rows corresponding to the gaze region, the control signal lines are controlled to transmit control signals, signals provided by the fixed potential lines are transferred to the scanning lines corresponding to the gaze region, and the signals provided by the scanning signal input lines are transferred to the scanning lines corresponding to the non-gaze region.

During specific implementation, when control poles of first transistors and control poles of second transistors are electrically connected to the same control signal line, the controlling the control signal lines to transmit the control signals, transferring the signals provided by the scanning signal input lines to the scanning lines corresponding to the gaze region, and transferring signals provided by the fixed potential lines to the scanning lines corresponding to the non-gaze region specifically includes:

the control signal lines in the gaze region are driven to transmit first control signals, and the control signal lines in the non-gaze region are driven to transmit second control signals, so as to control the first transistors in the gaze region to be turned on and the second transistors to be turned off, and control the first transistors in the non-gaze region to be turned off and the second transistors to be turned on; the signals provided by the scanning signal input lines are transferred to the scanning lines corresponding to control regions through the first transistors in the control regions; and at the same time, the signals provided by the fixed potential lines are transferred to the scanning lines corresponding to the non-gaze region through the second transistors in the non-gaze region.

The controlling, when the sub-pixel rows corresponding to the gaze region are scanned, the control signal lines to transmit control signals, transferring signals provided by the fixed potential lines to the scanning lines corresponding to the gaze region, and transferring the signals provided by the scanning signal input lines to the scanning lines corresponding to the non-gaze region includes:

the control signal lines in the gaze region are driven to transmit second control signals, and the control signal lines in the non-gaze region are driven to transmit first control signals, so as to control the first transistors in the gaze region to be turned off and the second transistors to be turned on, and control the first transistors in the non-gaze region to be turned on and the second transistors to be turned off; the signals provided by the scanning signal input lines are transferred to the scanning lines corresponding to non-gaze regions through the first transistors in the non-gaze regions; and at the same time, the signals provided by the fixed potential lines are transferred to the scanning lines corresponding to the gaze region through the second transistors in the gaze region.

During specific implementation, when the first transistors are P-type transistors and the second transistors are N-type transistors, the first signals are low-level signals, and the second signals are high-level signals; and when the first transistors are N-type transistors and the second transistors are P-type transistors, the first signals are high-level signals, and the second signals are low-level signals.

During specific implementation, when the control poles of first transistors are electrically connected to first control signal lines, and control poles of second transistors are electrically connected to second control signal lines, the controlling the control signal lines to transmit the control signals, transferring the signals provided by the scanning signal input lines to the scanning lines corresponding to the gaze region, and transferring signals provided by the fixed potential lines to the scanning lines corresponding to the non-gaze region includes:

the first control signal lines in the gaze region are driven to transmit the first control signals, the second control signal lines in the gaze region are driven to transmit the second control signals, the first control signal lines in the non-gaze region are driven to transmit third control signals, and the second control signal lines therein are driven to transmit fourth control signals, so as to control the first transistors in the gaze region to be turned on and the second transistors to be turned off, and control the first transistors in the non-gaze region to be turned off and the second transistors to be turned on; the signals provided by the scanning signal input lines are transferred to the scanning lines corresponding to control regions through the first transistors in the control regions; and at the same time, the signals provided by the fixed potential lines are transferred to the scanning lines corresponding to the non-gaze region through the second transistors in the non-gaze region.

The controlling, when the sub-pixel rows corresponding to the gaze region are scanned, the control signal lines to transmit control signals, transferring signals provided by the fixed potential lines to the scanning lines corresponding to the gaze region, and transferring the signals provided by the scanning signal input lines to the scanning lines corresponding to the non-gaze region includes:

the first control signal lines in the gaze region are driven to transmit third control signals, the second control signal lines in the gaze region are driven to transmit fourth control signals, the first control signal lines in the non-gaze region are driven to transmit first control signals, and the second control signal lines in the non-gaze region are driven to transmit second control signals, so as to control the first transistors in the gaze region to be turned off and the second transistors to be turned on, and control the first transistors in the non-gaze region to be turned on and the second transistors to be turned off; the signals provided by the scanning signal input lines are transferred to the scanning lines corresponding to non-gaze regions through the first transistors in the non-gaze regions; and at the same time, the signals provided by the fixed potential lines are transferred to the scanning lines corresponding to the gaze region through the second transistors in the gaze region.

In some embodiments, when the first transistors and the second transistors are all P-type transistors, the first signals and the fourth signals are low-level signals, and the second signals and the third signals are high-level signals. When the first transistors and the second transistors are all N-type transistors, the first signals and the fourth signals are high-level signals, and the second signals and the third signals are low-level signals. When the first transistors are P-type transistors, and the second transistors are N-type transistors, the first signals and the second signals are low-level signals, and the third signals and the fourth signals are high-level signals. When the first transistors are N-type transistors, and the second transistors are P-type transistors, the first signals and the second signals are high-level signals, and the third signals and the fourth signals are low-level signals.

In conclusion, according to the display panel, the display apparatus and the driving method thereof provided by the embodiments of the present disclosure, the display panel includes the control circuits as well as the control signal lines, the fixed potential lines and the scanning signal input lines that are electrically connected to the control circuits, so the control circuits may be used to transfer the signals provided by the scanning signal input lines or the signals provided by the fixed potential lines to the scanning lines. That is, in an image display process, for a region to be refreshed, the control circuits may be used to input normal scanning signals to the scanning lines corresponding to the pixel islands, and for a region not to be refreshed, the control circuits may be used to input fixed potential signals transmitted by the fixed potential lines to the scanning lines corresponding to the pixel islands. In this way, partitioned driving of the pixel islands can be realized by using the control circuits as well as the control signal lines, the fixed potential lines and the scanning signal input lines, and therefore, the energy consumption of a display product can be saved. In addition, the pixel islands are arranged in array, and each pixel island are electrically connected to the control circuits, so the partitioned control of the pixel islands in the display panel in the second direction can be realized.

While preferred embodiments of the present disclosure have been described, additional changes and modifications to these embodiments may be made by those of skill in the art once they are aware of basic inventive concepts. Therefore, appended claims are intended to be construed to include the preferred embodiments and all changes and modifications that fall within the scope of the present disclosure.

Obviously, those of skill in the art can make various modifications and variations to the embodiments of the present disclosure without departing from the spirit and scope of the embodiments of the present disclosure. Thus, provided that these modifications and variations of the embodiments of the present disclosure fall within the scope of the claims of the present disclosure and their equivalents, the present disclosure is also intended to cover such modifications and variations.

What is claimed is:

1. A display panel, comprising:
a first base substrate;
a plurality of scanning lines, located on a side of the first base substrate, extending in a first direction, and arranged in a second direction, wherein the first direction intersects with the second direction;
a plurality of data lines, located on the side of the first base substrate, extending in the second direction, and arranged in the first direction;
a plurality of sub-pixels, respectively located in regions divided by the plurality of scanning lines and the plurality of data lines, wherein at least two sub-pixels adjacent in the first direction and the second direction constitute a pixel island, the plurality of sub-pixels constitute a plurality of pixel islands, and each pixel island comprises n sub-pixel rows in the second direction;
a plurality of scanning signal input lines, in one-to-one correspondence to the scanning lines, extending in the first direction, and arranged in the second direction;
a plurality of control signal lines, extending in the second direction and arranged in the first direction;
a plurality of fixed potential lines; and
a plurality of control circuits, located between the adjacent sub-pixels, wherein one pixel island is connected to at least n control circuits correspondingly, and one control circuit corresponds to one row of sub-pixels in the pixel island; wherein
the control circuits are configured to: transfer, under control of the control signal lines, signals provided by the scanning signal input lines or signals provided by the fixed potential lines to the scanning lines;
each of the control circuit comprises: a first transistor and a second transistor; wherein
a control pole of the first transistor is electrically connected to one control signal line, a first pole of the first transistor is electrically connected to the scanning signal input lines, and a second pole of the first transistor is electrically connected to the scanning lines; and
a control poles of the second transistor is electrically connected to one control signal line, a first pole of the second transistor is electrically connected to the fixed potential lines, and a second pole of the second transistor is electrically connected to the scanning lines.

2. The display panel according to claim 1, wherein the control circuits are located between two sub-pixels adjacent in the first direction; and
the plurality of fixed potential lines extend in the first direction and are arranged in the second direction.

3. The display panel according to claim 2, comprising:
a first conductive layer, comprising the scanning lines, the scanning signal input lines, the fixed potential lines, the control pole of the first transistor and the control pole of the second transistor;
a second conductive layer, located on a side facing away from the first base substrate, of the first conductive layer, and comprising the data lines and the control signal lines; and
a third conductive layer, located on a side facing away from the first conductive layer, of the second conductive layer, and comprising the first pole and the second pole of the first transistor as well as the first pole and the second pole of the second transistor.

4. The display panel according to claim 3, wherein the sub-pixels comprise a driving transistor, and the first conductive layer further comprises: a control pole of the driving transistor electrically connected to the scanning lines;
the second conductive layer further comprises: a first pole of the driving transistor; and
the third conductive layer further comprises: a second pole of the driving transistor.

5. The display panel according to claim 4, wherein in each of the control circuits, the first transistor and the second transistor are arranged into two rows in the first direction.

6. The display panel according to claim 5, wherein in each of the control circuits, an orthographic projection of the control pole of the first transistor on a plane perpendicular to the first direction does not overlap an orthographic projection of the control pole of the second transistor on the plane perpendicular to the first direction.

7. The display panel according to claim 6, wherein the first pole and the second pole of the first transistor are arranged in the second direction; and
the first pole and the second pols of the second transistors are arranged in the second direction.

8. The display panel according to claim 7, wherein the third conductive layer further comprises: a first input lead, a second input lead, a first output lead and a second output lead;
wherein
the first input lead is electrically connected to the first pole of the first transistor and electrically connected to the scanning signal input line;
the second input lead is electrically connected to the first pole of the second transistor and electrically connected to the fixed potential lines;
the first output lead is electrically connected to the second pole of the first transistor and electrically connected to the scanning lines;
the second output lead is electrically connected to the second pole of the second transistor and electrically connected to the scanning lines; and
the first input lead, the second input lead, the first output lead and the second output lead all extend in the second direction.

9. The display panel according to claim 1, wherein the control circuits are located between two sub-pixels adjacent in the second direction; and
the plurality of fixed potential lines extend in the second direction and are arranged in the first direction.

10. The display panel according to claim 9, comprising:
a first conductive layer, comprising the scanning lines, the control pole of the first transistor and the control pole of the second transistors;
a second conductive layer, located on a side facing away from the first base substrate, of the first conductive layer and comprising the scanning signal input lines;
a third conductive layer, located on a side facing away from the first conductive layer, of the second conductive layer and comprising the data lines; and
a fourth conductive layer, located on a side facing away from the second conductive layer, of the third conductive layer and comprising the control signal lines, the fixed potential lines, the first pole and the second pole of the first transistor as well as the first pole and the second pole of the second transistor, wherein orthographic projections of the control signal lines and the fixed potential lines on the first base substrate overlap part of orthographic projections of the data lines on the first base substrate.

11. The display panel according to claim 10, wherein the fourth conductive layer further comprises: a plurality of first output leads and a plurality of second output leads extending in the second direction;

the second pole of the first transistor is electrically connected to the scanning lines through the first output leads;

the second pole of the second transistor is electrically connected to the scanning lines through the second output leads; and orthographic projections of the first output leads and the second output leads on the first base substrate overlap part of the orthographic projections of the data lines on the first base substrate.

12. The display panel according to claim 10, wherein the sub-pixels comprise a driving transistor;

the first conductive layer further comprises: a control pole of the driving transistor electrically connected to the scanning lines;

the second conductive layer further comprises: a first pole of the driving transistor; and the display panel further comprises:

a fifth conductive layer, located on a side facing away from the third conductive layer, of the fourth conductive layer and comprising a second pole of the driving transistor.

13. The display panel according to claim 10, wherein the control circuits corresponding to each pixel island are arranged into one row in the first direction.

14. The display panel according to claim 13, wherein the first pole of the first transistor, the control pole of the first transistor, and the second pole of the first transistor are arranged in the first direction; and the first pole of the second transistor, the control pole of the second transistor, and the second pole of the second transistor are arranged in the first direction.

15. The display panel according to claim 14, further comprising: an active layer located between the first conductive layer and the first base substrate; wherein the active layer comprises an active layer of the first transistor and an active layer of the second transistor;

the active layer of the first transistor comprises parts extending in the first direction; and the active layer of the second transistor comprises parts extending in the first direction.

16. The display panel according to claim 15, wherein the fourth conductive layer further comprises: a plurality of first output leads and a plurality of second output leads extending in the second direction;

the second pole of the first transistor is electrically connected to the scanning lines through the first output leads;

the second pole of the second transistor is electrically connected to the scanning lines through the second output leads; and orthographic projections of the first output leads and the second output leads on the first base substrate overlap part of the orthographic projections of the data lines on the first base substrate.

17. The display panel according to claim 16, further comprising: a first gate insulating layer located between the first conductive layer and the active layer, a second gate insulating layer located between the first conductive layer and the second conductive layer, a first interlayer insulating layer located between the second conductive layer and the third conductive layer, a second interlayer insulating layer located between the third conductive layer and the fourth conductive layer, and a third interlayer insulating layer located between the fourth conductive layer and the fifth conductive layer; wherein the fourth conductive layer further comprises: a plurality of first connecting pads, a plurality of second connecting pads, a plurality of third connecting pads, a plurality of fourth connecting pads, and a plurality of fifth connecting pads;

the second pole of the driving transistor is electrically connected to the active layer through a via hole that penetrates through the third interlayer insulating layer, the second interlayer insulating layer, the first interlayer insulating layer, the second gate insulating layer and the first gate insulating layer;

the first input leads are electrically connected to the first connecting pads, and the first connecting pads are electrically connected to the scanning signal input lines through via holes that penetrate through the second interlayer insulating layer and the first interlayer insulating layer;

the first output leads are electrically connected to the second connecting pads, and the second connecting pads are electrically connected to the scanning lines through via holes that penetrate through the second interlayer insulating layer, the first interlayer insulating layer and the second gate insulating layer;

first control signal lines are electrically connected to the third connecting pads, and the third connecting pads are electrically connected to the control pole of the first transistor through via holes that penetrate through the second interlayer insulating layer, the first interlayer insulating layer and the second gate insulating layer;

second control signal lines are electrically connected to the fourth connecting pads, and the fourth connecting pads are electrically connected to the control pole of the second transistor through via holes that penetrate through the second interlayer insulating layer, the first interlayer insulating layer and the second gate insulating layer; and the second output leads are electrically connected to the fifth connecting pads, and the fifth connecting pads are electrically connected to the scanning lines through via holes that penetrate through the second interlayer insulating layer, the first interlayer insulating layer and the second gate insulating layer; wherein in regions where the second pole of the driving transistor is electrically connected to the active layer, the first interlayer insulating layer, the second gate insulating layer and the first gate insulating layer comprise first via holes; in regions where the second connecting pads are electrically connected to the scanning lines, the first interlayer insulating layer and the second gate insulating layer comprise second via holes; and in the regions where the second pole of the driving transistor is electrically connected to the active layer and the regions where the second connecting pads are electrically connected to the scanning lines, the second interlayer insulating layer comprises third via holes that expose the first via holes and the second via holes.

18. The display panel according to claim 13, further comprising:

a pixel electrode layer, located on a side facing away from the fourth conductive layer, of the fifth conductive layer and comprising a plurality of pixel electrodes in one-to-one correspondence to the sub-pixels, wherein the pixel electrodes are electrically connected to the second pole of the driving transistor;

a common electrode layer, located on a side facing away from the fifth conductive layer, of the pixel electrode layer;

a plurality of supporting parts, located on a side facing away from the pixel electrode layer, of the common electrode layer, wherein orthographic projections of the supporting parts on the first base substrate are between adjacent sub-pixel rows, and the control circuits are located between the sub-pixel rows provided with the supporting parts; and an opposing substrate, located on a side facing away from the common electrode layer, of the supporting parts and comprising a plurality of light shielding parts extending in the first direction and arranged in the second direction, wherein orthographic projections of the light shielding parts on the first base substrate cover the orthographic projections of the supporting parts on the first base substrate and the orthographic projections of the control circuits on the first base substrate.

19. The display panel according to claim 18, wherein each of the pixel islands comprises: a first sub-pixel row, a second sub-pixel row and a third sub-pixel row;

the first sub-pixel row comprises a plurality of first color sub-pixels arranged in the first direction;

the second sub-pixel row comprises a plurality of second color sub-pixels arranged in the first direction;

the third sub-pixel row comprises a plurality of third color sub-pixels arranged in the first direction; and the orthographic projections of the supporting parts on the first base substrate are located between the first sub-pixel row and the third sub-pixel row.

20. The display panel according to claim 19, wherein the first color sub-pixels are red sub-pixels, the second color sub-pixels are green sub-pixels and the third color sub-pixels are blue sub-pixels.

21. The display panel according to claim 1, wherein the control pole of the first transistor and the control pole of the second transistor are electrically connected to a same control signal line; and the first transistor is a N-type transistor, and the second transistor is a P-type transistor; or, the first transistor is a P-type transistor, and the second transistors is a N-type transistor.

22. The display panel according to claim 1, wherein the control pole of the first transistor and the control pole of the second transistor are electrically connected to different control signal lines.

23. The display panel according to claim 1, wherein one row of the sub-pixels arranged in the first direction are in same color.

24. The display panel according to claim 23, wherein the plurality of pixel islands are divided into a plurality of control regions, and each of the control regions comprises at least one pixel island; and each of the scanning lines comprises: a plurality of sub-scanning lines arranged in the first direction and disconnected from one another; and in each scanning line, a quantity of the sub-scanning lines are same as a quantity of the control regions arranged in the first direction in one row, and each of the sub-scanning lines corresponds to one row of sub-pixels in one control region.

25. The display panel according to claim 24, wherein in each of the control regions, one row of pixel islands arranged in the first direction are connected to n control circuits correspondingly.

* * * * *